United States Patent
Kawamura et al.

(12)
(10) Patent No.: US 6,663,468 B2
(45) Date of Patent: Dec. 16, 2003

(54) METHOD FOR POLISHING SURFACE OF SEMICONDUCTOR DEVICE SUBSTRATE

(75) Inventors: Yoshio Kawamura, Kokubunji (JP); Kan Yasui, Kokubunji (JP); Masahiko Sato, Kumagaya (JP); Souichi Katagiri, Kodaira (JP); Masayuki Nagasawa, Kawagoe (JP); Kunio Harada, Hachioji (JP); Satoshi Osabe, Higashimurayama (JP); Ui Yamaguchi, Urawa (JP)

(73) Assignee: Hitachi, Ltd., Tokyo (JP)

( * ) Notice: Subject to any disclaimer, the term of this patent is extended or adjusted under 35 U.S.C. 154(b) by 190 days.

(21) Appl. No.: 09/754,193

(22) Filed: Jan. 5, 2001

(65) Prior Publication Data

US 2001/0007795 A1 Jul. 12, 2001

(30) Foreign Application Priority Data

Jan. 7, 2000 (JP) ......................... 2000-005866

(51) Int. Cl.$^7$ ................................................ B24B 1/00
(52) U.S. Cl. .......................... 451/41; 451/63; 451/287; 451/288; 451/307; 451/398
(58) Field of Search ..................... 451/41, 5, 8, 60, 451/63, 285–295, 307, 398

(56) References Cited

U.S. PATENT DOCUMENTS

| | | | | |
|---|---|---|---|---|
| 5,486,129 A | * | 1/1996 | Sandhu et al. ................. 451/5 |
| 5,643,061 A | * | 7/1997 | Jackson et al. ............... 451/289 |
| 5,762,544 A | * | 6/1998 | Zuniga et al. ............... 451/285 |
| 5,795,215 A | * | 8/1998 | Guthrie et al. ............... 451/286 |
| 6,000,339 A | * | 12/1999 | Matsuzawa ............ 106/287.14 |
| 6,093,091 A | * | 7/2000 | Keller ........................ 451/388 |
| 6,106,379 A | * | 8/2000 | Mosca ........................ 451/288 |
| 6,113,468 A | * | 9/2000 | Natalicio ..................... 451/41 |
| 6,241,591 B1 | * | 6/2001 | Jackson et al. ............. 451/287 |
| 6,251,215 B1 | * | 6/2001 | Zuniga et al. ......... 156/345.12 |
| 6,267,655 B1 | * | 7/2001 | Weldon et al. .............. 451/307 |
| 6,316,364 B1 | * | 11/2001 | Kubo ......................... 438/692 |

FOREIGN PATENT DOCUMENTS

| | | | |
|---|---|---|---|
| EP | 1148538 | * 10/2001 | ......... H01L/21/304 |
| JP | 6-155286 | 6/1994 | |
| JP | 7-314298 | 12/1995 | |
| JP | 9-117860 | 5/1997 | |
| JP | 9-232260 | 9/1997 | |
| JP | 9-267257 | 10/1997 | |
| JP | 10-286758 | 10/1998 | |
| JP | 10-315125 | 12/1998 | |
| JP | 11-163103 | 6/1999 | |
| JP | 11-277417 | 10/1999 | |

* cited by examiner

*Primary Examiner*—M. Rachuba
(74) *Attorney, Agent, or Firm*—Mattingly, Stanger & Malur, P.C.

(57) ABSTRACT

The problem of non-uniform polishing properties of a circumferential surface area of a substrate, so-called edge sagging phenomenon, is solved. When a thin film formed on a top surface of the substrate is polished while holding a back surface of the substrate, local stress at a circumferential end of the substrate is reduced by a guide installed so as to surround the substrate. Also, a deformation of the outer circumferential end portion of the substrate is reduced by a recessed groove provided on the guide. Since a thin film formed on the surface can be polished to be flat throughout the surface of the substrate without an occurrence of non-uniform polishing properties of the outer circumferential surface area of the substrate, so-called edge sagging phenomenon, a high-performance semiconductor device can be manufactured at a high yield and low costs.

19 Claims, 11 Drawing Sheets

METHOD FOR POLISHING SURFACE OF SEMICONDUCTOR DEVICE SUBSTRATE

BACKGROUND OF THE INVENTION

The present invention relates to a method for chemically and mechanically polishing and processing thin films formed on a surface of a substrate of a semiconductor device by using a polishing member.

PRIOR ART

In the manufacturing process of highly integrated semiconductor devices such as DRAMs (Dynamic Random Access Memories) or the like having a density of not less than 256 megabits, fine patterns of a minimum dimension of not more than 0.2 μm are often formed. In order to form such fine patterns at a high precision using photolithography, decrease in the wavelength of exposing light and increase in the number of apertures are required. Accordingly, the allowable focal depth of reduction projection exposure equipment used in the photolithographic process becomes shallow. In order to expose and transfer a fine circuit pattern onto a photosensitive film (photoresist film) on a thin film formed on the surface of a substrate at a high resolution using the photolithographic process, the flatness of the surface of the photosensitive film, which is the surface to be exposed, must be not more than 0.3 μm.

As a method for obtaining the flat property of the surface of a photosensitive film, JP-A-7-314298 specification discloses a reflow planarizing method, in which an insulating film used as the base to form a photosensitive film is softened by heating for allowing the insulating film to reflow. Furthermore, there are known such an etching method for melting and flattening a convex part of the insulating film and chemical mechanical polishing (CMP) method, in which insulating films are polished chemically and mechanically using slurry and a polishing pad, the slurry comprising a processing liquid in which powder or grinding grains are contained.

Also, a method in which when a wafer contacts a retainer, the entire retainer deforms in accordance with the change in shape of the wafer, is known, such as the method disclosed in JP-A-11-277417 specification.

Although conventional reflow planarizing or etching methods can locally planarize stepped portions, they have a problem in that flatness to satisfy the shallow allowable focal depth of exposure equipment throughout a wide area (not less than 30 mm in diameter) of a semiconductor substrate. On the other hand, conventional chemical and mechanical polishing gives better flatness than a reflow planarizing method. However, since the conventional chemical and mechanical polishing method polishes the surface of the substrate by pushing the surface of the thin film formed on the surface of a substrate against a flexible polishing cloth, which is a polishing member, (e.g. a polyurethane polishing pad of a modulus of longitudinal elasticity of not more than 1,000 kg/cm$^2$), this method has a problem in that the polishing cloth is deformed non-uniformly by the pushing force of the surface of the substrate, and the flatness after processing is lowered. For example, as JP-A-9-267257 specification and JP-A-10-286758 specification disclose, the polishing cloth in the vicinity of the circumference of the substrate is caved or waved by the pushing force of the substrate, so that polishing properties of the circumferential surface of the substrate became non-uniform to thereby cause, so-called, edge sagging phenomenon.

The larger the pushing force of the substrate against the polishing member, that is, the higher the processing surface pressure, the worse the flatness of the surface of the substrate after processing. If the processing surface pressure is lowered to reduce the phenomenon of worsened flatness, the problem of the drop in polishing efficiency to thereby increase processing time and thus lower the throughput thereof was caused.

On the other hand, JP-A-9-232260 specification discloses a method for processing the surface of a substrate using a grinding stone which is manufactured by binding grinding grains for polishing with a resin (binded grinding grain disk), instead of using abrasives and abrasive cloth. Since the grinding stone is more rigid than abrasive cloth (e.g. the modulus of longitudinal elasticity of not less than 5,000 kg/cm$^2$), the flatness of the surface of the substrate in non-uniform circuit pattern areas is improved, but non-uniform polishing properties of the outer circumferential surface of the substrate, that is, so-called edge sagging phenomenon could not have been solved.

Also, JP-A-6-155286 specification and JP-A-9-117860 specification disclose methods for preventing the wafer from approaching the polishing member side by providing an inclined surface on the structure body of the inner wall surface of the guide provided on the outer circumference of the wafer, or preventing the wafer from getting out of an inside of a guide and preventing the excessive polishing of the other circumferential end portion of the wafer. In these prior arts, however, the outer circumference end of the wafer goes up and down an inclined plane of the guide due to the variation of thrust applied thereto, and the excessive movement to the opposite side to the polishing member can not be prevented. Accordingly, since the ability of controlling the position and maintaining the contact of the outer circumference of the wafer is not satisfactory, non-uniform polishing properties of the outer circumferential surface of the substrate, that is, so-called edge sagging phenomenon could not have been solved, when grindstone that is more rigid than abrasive cloth is used as a polishing member.

Furthermore, JP-A-10-315125 specification discloses a method for aiming uniform polishing by changing load applied to the back surface of the wafer between the inner area and the outer area. In this method, since taking measures to meet against the thrust generated from the load and the friction coefficient cannot be performed, non-uniform polishing properties of the outer circumferential surface area of the substrate, that is, so-called edge sagging phenomenon could not have been solved, when rigid grindstone is used as a polishing member.

The inventors of the present invention had experimentally for the first time found a phenomenon that the deformation of grindstone as used for a polishing member does not occur when using the grindstone having a high-rigidity surface, but that the substrate is deformed when it is pushed against the guide of the carrier by the thrust generated in the direction of the substrate surface due to the load when polishing and friction. It was newly found that this phenomenon causes non-uniform polishing properties of the outer circumferential surface area of the substrate, that is,, so-called edge sagging phenomenon.

FIGS. 7 and 8 are schematic view showing prior art techniques for polishing substrates using grindstones.

FIG. 7 is a schematic view of a wafer 2 and a guide 83 pushed against the surface of a grindstone 1, when viewed from above. In order to accommodate the dimensional tolerance of the outer diameter of the wafer 2, and to facilitate attaching to or detaching from the carrier (not shown) in automatically conveying the wafer, the inner diameter of the guide 83 is normally made to be about 1 mm larger than the outer diameter of the wafer 2. As a result, the gap 10 is produced between an inner wall of the guide 83 and the outer circumference of the wafer 2. The grindstone surface 1 rotates in the direction of the arrow 4, while the wafer 2 and the guide 83 rotate in the direction of the arrow 5 with they being integrated with the carrier. A friction force by polishing Fp is applied to the surface of the wafer 2, due to two relative motions whose diameters and the centers of rotation are different from each other. The wafer 2 is held in the carrier by an elastic member (not shown) so as to generate a holding force Fc. The wafer 2 moves within an area defined by an inner wall of the guide 83 by the difference in force between the friction force by polishing Fp and the holding force Fc, and pushes the wafer 2 against the inner wall of the guide 83 so as to generate a reaction force Fg. Since the outer diameter of the wafer 2 is smaller than the inner diameter of the guide 83, the pushed outer circumference of the wafer 2 cannot contact with the inner wall of the guide 83 by the entire outer circumference thereof, but contacts at a point with the inner wall of the guide 83. As a result, the reaction force Fg to the wafer 2 is concentrated in this point. The equilibrium relationship between the above-mentioned forces in the direction of the surface of the wafer 2 is Fp=Fg+Fc.

FIGS. 8A and 8B are schematic views showing an enlarged sectional side view and a characteristic graph showing the polishing rate in the vicinity of the outer circumferential end portion on the diameter of the wafer. The abscissa axis of the characteristic graph shows the position on the diameter of the wafer, with 0 being the center, positive values being the right side of the center, and negative values being the left side of the center. In the present invention, the graph shows the data for the left half when a wafer having a diameter of 200 mm is used. The ordinate axis shows the relative polishing rate indicated by relative values standardized by the mean polishing rate in the vicinity of the center area of the wafer. Since the position and the size of the point of inflection of characteristic curves are varied by polishing conditions, the graph of the present invention shows only an example of thereof.

A polishing load Pb is applied to the back surface of the wafer 2 through an elastic member 6, and the thin film 87 on the surface of the wafer 2 is pushed against the grindstone surface 1. A polishing liquid 88 intervenes between the thin film and the grindstone surface 1. A polishing friction force Fp, determined by the product of the friction coefficient μp between the thin film 87 on the surface of the wafer and the grindstone surface 1, and the polishing load Pb is generated (Fp=Pb×μp), so that thrust is applied to the wafer 2 in the direction of the rotation of the grindstone. The thus polishing friction force Fp which is applied to the wafer balances with the retaining force Fc, determined by the product of the friction coefficient μw between the elastic member 6 and the back surface of the wafer, and the polishing load Pb (Fc=Pb×μw) and the reaction force Fg from the guide 89. When the prior art technique is used, in the wafer 2 as thin as about not more than 1 mm, the reaction force Fg caused local deformations 91 or 92 in the outer circumferential area of the substrate about 30 mm from the outer circumferential end of the wafer.

FIG. 8A shows the case where the outer circumferential end portion 90 of the wafer has been deformed in such a way that it is pushed against the surface of the grindstone, in which the relative polishing rate of the portion 93 of the polishing rate curve on the surface of the wafer is higher than that of the average portion 12 of the polishing rate curve therein is exhibited, and a portion in which a sudden change is caused due to the reaction of local deformation 'so-called' "rebound" exhibits a portion 94 of a low value of the polishing rate curve. The minimum relative polishing rate of the portion 94 of a low value of the polishing rate curve is within a range about 0.8 to 0.5, and the position of the wafer diameter appears within a range about −75 to −95 mm. As a result, the polishing properties in the vicinity of the outer circumferential portion of the wafer became non-uniform, causing edge sagging phenomenon due to excessive polishing.

FIG. 8-*b* shows the case where the outer circumferential end portion 90 of the wafer has been deformed in such a way that it is lifted up from the surface of the grindstone, in which the relative polishing rate of the portion 95 of the polishing rate curve is lower than that of the average portion 12 of the polishing rate curve on the surface of the wafer, a portion in which a sudden change is caused due to the reaction of local deformation 'so-called' "rebound" exhibits a portion 97 of a high value of the polishing rate curve. The maximum relative polishing rate of the portion 97 of a high value of the polishing rate curve is within a range about 1.2 to 2.0, and the position of the wafer diameter appears within a range about −75 to −95 mm. As a result, the polishing properties in the vicinity of the outer circumferential portion of the wafer became non-uniform, causing edge sagging phenomenon due to the shortage of polishing.

An object of the present invention is to provide a method: for dissolving a polishing and processing characteristic of an outer circumferential surface area of a substrate becoming non-uniform, that is, the edge sagging phenomenon by which the substrate is pushed and deformed by a guide of a carrier caused by thrust which is generated by processing load and friction and is applied in the direction of the surface of the substrate; and for controlling the polishing and processing characteristic including the outer circumferential area of the substrate.

Another object of the present invention is to provide a method for manufacturing a semiconductor device that can improve throughput, by planarizing the protruded portions of the circuit pattern formed on the surface of the semiconductor substrate, and by reducing or preventing the polishing of the recessed portions so as to reduce the polishing time.

A still another object of the present invention is to provide a method for manufacturing a semiconductor device that can reduce or eliminate the occurrence of non-uniform thickness of the thin film formed on the surface of the wafer by planarizing the protruded portions of the thin film formed on the surface of the semiconductor substrate, and by reducing or preventing the polishing of the recessed portions.

SUMMARY OF THE INVENTION

According to an embodiment of the present invention, the above objects can be achieved by polishing the thin film formed on the surface of a semiconductor substrate so as to disperse the reaction force generated when the substrate is pushed against a guide provided around the substrate, while holding the back surface of the substrate having the thin film on the surface thereof with a carrier; or by polishing the thin film so as to hold the semiconductor substrate with the guide having an elastic body on the inner wall thereof, provided around the substrate, while holding the back surface of the substrate having the thin film on the surface thereof; or by polishing the thin film so as to minimize deformation in the vertical direction when a substrate having the thin film on the surface is pushed against a guide having a recessed groove on the inner wall thereof, provided around the substrate, and the outer edge of the substrate is fixed by the depressed groove.

The polishing friction force, determined by the product of the polishing load to push the substrate against a polishing member from the back surface of the substrate and the friction coefficient between the polishing member and the thin film on the surface of the substrate, can be put in another way, under the relationship determined by the sum of the holding force on the substrate determined by the product of the polishing load and the friction coefficient between the back surface of the substrate and the elastic member of the carrier and the reaction force from a guide pushed by and contacted with the outer circumstance of the substrate, (polishing friction force)=(polishing load)×(friction coefficient between polishing member and thin film on substrate), (substrate holding force)=(polishing load)×(friction coefficient between elastic member of carrier and back surface of substrate), (polishing friction force)=(substrate holding force)+(reaction force from guide to substrate), or (reaction force from guide to substrate)=(polishing friction force)−(substrate holding force).

As a result, polishing and processing are uniformly executed up to the outer circumferential end, and thereby it becomes possible to manufacture a semiconductor device without causing any edge sagging phenomenon.

Furthermore, since the reaction force from the guide to the substrate can be reduced by increasing the holding force on the substrate, the local deformation of the outer circumferential end of the substrate can be prevented. As a result, since the local deformation of the outer circumferential area of the substrate can be prevented, the substrate can be polished uniformly up to the outer circumferential end of the substrate, and a semiconductor device without causing edge sagging phenomenon can be manufactured.

Also, since the polishing conditions can be controlled by restricting the height of the outer circumferential end of the substrate with the groove on the inner wall of the guide, the uniformity of polishing is further improved up to the outer circumferential area of the substrate. As a result, the substrate can be polished uniformly up to the outer circumferential end of the substrate, and a semiconductor device without causing edge sagging phenomenon can be manufactured.

Since the upper and lower surfaces of the groove on the inner wall of the guide contact with the arced inclined surface on the outer circumstance of the substrate so as to sandwich the edge of the substrate, by restricting the height of the outer circumferential end of the substrate with the groove on the inner wall of the guide, an action is served to further increase the effective contact area, so that the concentration of the reaction force from the guide to the substrate is diffused and relaxed to enable the prevention of the local deformation of the outer circumferential end the of substrate, the substrate can be polished uniformly up to the outer circumferential end of the substrate, and a semiconductor device without causing edge sagging phenomenon can be manufactured.

In the method for manufacturing a semiconductor device with the chemical mechanical polishing method using a grindstone, that is a fixed grinding disc, the inventors of the present invention experimentally have found for the first time the phenomenon in which a substrate as thin as about not more than 1 mm deforms locally when the substrate is pushed against the guide of a carrier by the thrust generated due to the polishing load and friction applied in the direction of the substrate surface, although the polishing member that has a high rigidity, such as a grindstone, is not deformed by the pushing load of the substrate, as described in the prior art technique indicated by FIGS. 7 and 8. The inventors clarified that this phenomenon makes the polishing properties for the outer circumferential surface of the substrate non-uniform, and caused so-called edge sagging phenomenon.

The present invention was devised based on the above-described findings.

The residual film as described herein is the thickness of the film after polishing the portions of the same level of the pattern which is arranged and formed in a scattered manner on a semiconductor substrate, that is, the distance between the surface of the thin film and the surface of the substrate. Therefore, the thickness non-uniformity of the remaining film is expressed by abbreviating the remaining film of any point P within the substrate surface, the polishing rate, and the polished quantity to (Remaining film P), (Polishing rate P) and (Polishing quantity P), respectively, in the following equations:

(Remaining film)=(Film thickness after polishing)=(Film thickness before polishing)−(Polished quantity)

therefore, (Remaining film P)=(Film thickness before polishing)−(Polished quantity P)=(Film thickness before polishing)−(Polishing rate P)×(Polishing time)

(Thickness non-uniformity of remaining film) =(Remaining film P1)−(Remaining film P2)={(Polishing rate P2)−(Polishing rate P1)}×(Polishing time)=(Difference in polishing rate)×(Polishing time)

This difference in polishing rate between point P1 and point P2 is caused by the variation and non-uniformity of the polishing rate within the substrate surface.

BRIEF DESCRIPTION OF THE DRAWINGS

FIGS. 1A and 1B each being a schematic view showing the method for polishing the surface of a substrate for a semiconductor device according to a first embodiment of the present invention; wherein FIG. 1A is a schematic sectional view of a plane of a wafer 2 and a guide 3 pushed against the surface of grindstone 1, and FIG. 1B is a schematic view showing an enlarged sectional side view of the system, and a graph of the characteristic curve showing the polishing rate in the vicinity of the outer circumferential end portion on the diameter of the wafer during polishing, FIGS. 2A and 2B each being a schematic view showing the method for polishing the surface of a substrate for a semiconductor device according to a second embodiment of the present invention; wherein each of FIGS. 2A and 2B shows an example of the cross-sectional shape in the vicinity of the outer circumferential end portion of the wafer and polishing rate properties, when polishing each wafer with the distance being changed between the guide 23 and the grindstone surface 1 to g1 or g2 (g1<g2), FIGS. 3A and 3B each being a schematic diagram showing the method for polishing the surface of a substrate for a semiconductor device according to a third embodiment of the present invention; wherein FIG. 3B is a schematic view showing an enlarged sectional side view of the system, and a graph of the characteristic curve showing the polishing rate in the vicinity of the outer circumferential end portion on the diameter of the wafer during polishing, FIGS. 4A and 4B each being a schematic view showing the method for polishing the surface of a substrate for a semiconductor device according to a fourth embodiment of the present invention; wherein FIG. 4B is an enlarged schematic sectional side view, and a graph showing the polishing rate in the vicinity of the outer circumferential end portion on the diameter of the wafer 42, FIGS. 5A and 5B each being a schematic view showing the method for polishing the surface of a substrate for a semiconductor device according to a fifth embodiment of the present invention; wherein FIG. 5B is an enlarged schematic sectional side view, and a graph showing the polishing rate in the vicinity of the outer circumferential end portion on the diameter of the wafer 2, FIGS. 6A and 6B each being a schematic view showing the method for polishing the surface of a substrate for a semiconductor device according to a sixth embodiment of the present invention; wherein FIG. 7 is a schematic view of a wafer 2 and a guide 83 pushed against the surface of a grindstone 1, when viewed from above, FIGS. 8A and 8B each being a schematic view showing the method for polishing the surface of a substrate for a semiconductor device according to another prior art technique, each of which is a schematic view showing an enlarged sectional side view and a characteristic graph showing the polishing rate in the vicinity of the outer circumferential end portion on the diameter of the wafer; wherein

PREFERRED EMBODIMENTS OF THE INVENTION

Embodiment 1

Figure 1A:
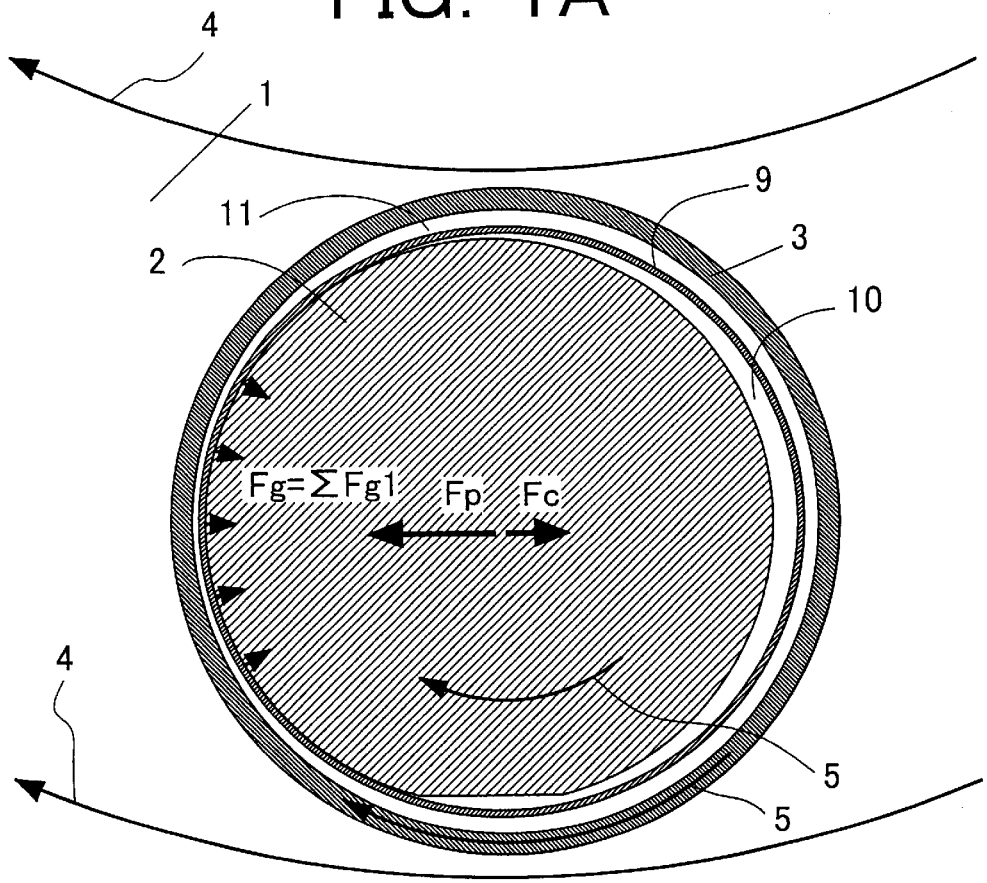

An embodiment of the present invention will be described below referring to the drawings. In the drawings, the same reference numerals are used for components of the same functions.

Figure 1B:
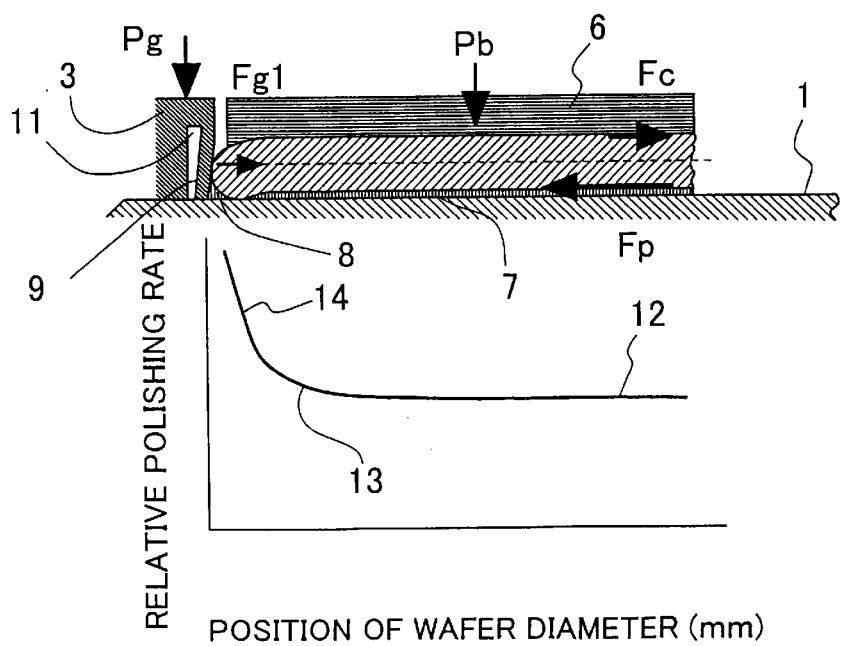

Each of FIGS. 1A and 1B is a schematic view showing the method for polishing the surface of a substrate for a semiconductor device according to a first embodiment of the present invention.

FIG. 1A is a schematic sectional view of a plane of a wafer 2 and a guide 3 pushed against the surface of grindstone 1, when viewed from above. The grindstone 1 is rotated in the direction of the arrow 4, and the wafer 2 and the guide 3 are rotated in the direction of the arrow 5. From the difference of these two rotations, the relative motion of the grindstone 1 produces a processing friction force Fp on the surface of the wafer. FIG. 1B is a schematic view showing an enlarged sectional side view of the system, and a graph of the characteristic curve graph showing the polishing rate in the vicinity of the outer circumferential end portion on the diameter of the wafer during polishing. Also in the following graph of the characteristic curve graph, the abscissa axis of the characteristic graph shows the position on the diameter of the wafer (that is, wafer-diameter position), with 0 being the center, positive values being the right side of the center, and negative values being the left side of the center. In the present invention, the left half data, when a wafer having a diameter of 200 mm is used, is shown. Also, the ordinate shows the relative polishing rate indicated by relative values standardized by the mean polishing rate in the vicinity of the center of the wafer. Since the position and the size of the point of inflection of the characteristic curve varies depending on the polishing conditions, the present invention shows only one of examples.

The guide 3 is a structure body that has a thin inner wall 9, which can be deformed toward the side of the outer region 11 of the inner wall 9.

A polishing load Pb is applied to the back surface of the wafer 2 through an elastic member 6 to push the thin film 7 on the surface of the wafer 2 against the surface of a grindstone 1. A polishing liquid 8 intervenes between the thin film and the grindstone surface 1. The polishing friction force Fp determined by the product of the friction coefficient $\mu p$ between the thin film 7 on the surface of the wafer and the surface of grindstone 1, and the polishing load Pb (Fp=Pb×$\mu p$) is generated, so that thrust in the rotating direction of the grindstone is applied to the wafer 2. The polishing friction force Fp applied to the wafer 2 is balanced with the holding force Fc determined by the product of the friction coefficient $\mu w$ between the elastic member 6 and the back surface of the wafer 2, and the polishing load Pb (Fc=Pb×$\mu w$), and the drag Fg from the inner wall 9. That is, the wafer 2 is retained in the carrier with the elastic member 6 and thus the holding force Fc is generated. The differential force between the polishing friction force Fp and the holding force Fc pushes the wafer 2 against the guide to generate the drag Fg, and a gap 10 is formed in the opposite side by deforming of the thin inner wall 9. The force in the direction of the wafer surface satisfies the equation concerned Fp=Fg+Fc.

The materials of the guide include resins such as polyacetal (POM), polyphenylene sulfide (PPS), and ultra high molecular weight polyethylene (UHMWPE). In this embodiment, a ring-shaped groove 11 of a width of 0.5 to 1.0 mm and a depth of 5 mm was formed inside a cylinder of a POM resin having a height of 7.5 mm, an outer diameter of 236 mm, and an inner diameter of 204 mm, as the guide of the structure body having a thin inner wall 9, to form the structure body of the inner wall 9 of a width of 0.5 to 0.9 mm and a height of 5 mm.

The thrust generated by the relative motion between the grindstone surface 1 and the wafer 2 pushes the wafer 2 against the guide, and the inner wall 9 of the guide is deformed in such a way that it contacts following with the outer circumference of the wafer 2, generating the drag Fg (Fg=Fp−Fc) on the wafer 2. Since the inner wall of the guide following, the contact area of the guide with the outer circumferential end of the wafer 2 increases, and the drag Fg1 per unit length applied to the outer circumferential end of the wafer 2 is dispersed as (Fg=ΣFg1), and decreases. As a result, the quantity of deformation in the vicinity of the outer circumference of the wafer 2 decreases, and the effect of "rebound" due to the reaction of local deformation does not appear on the polishing rate, but exhibits gentle change as shown by the portion 13 of the polishing rate curve. The portion 14 where the polishing rate of the curve is higher than that of the portion 12 of the average polishing rate is caused by that the inner wall 9 of the guide deforms and inclines due to thrust to generate the components of the force pushing the surface of the grindstone.

If the polishing member is an elastic body of a low hardness with a modulus of longitudinal elasticity of not more than 1,000 kg/cm$^2$ (98 Mpa), a problem of poor planarizing properties arises, because the surface profile of the polishing member follows the profile of the recessed portions of the pattern on the semiconductor substrate, and with the progress of polishing, the recessed portions of the pattern is polished, although the average thickness of the thin film decreases. It is therefore preferable that the grindstone constituting the grindstone surface 1 is a fixed grind disc of a modulus of longitudinal elasticity of not less than 3,000 kg/cm$^2$ (294 Mpa), in which fine abrasives of a suitable hardness are dispersed.

Embodiment 2

Another embodiment of the present invention will be described below.

Figure 2A:
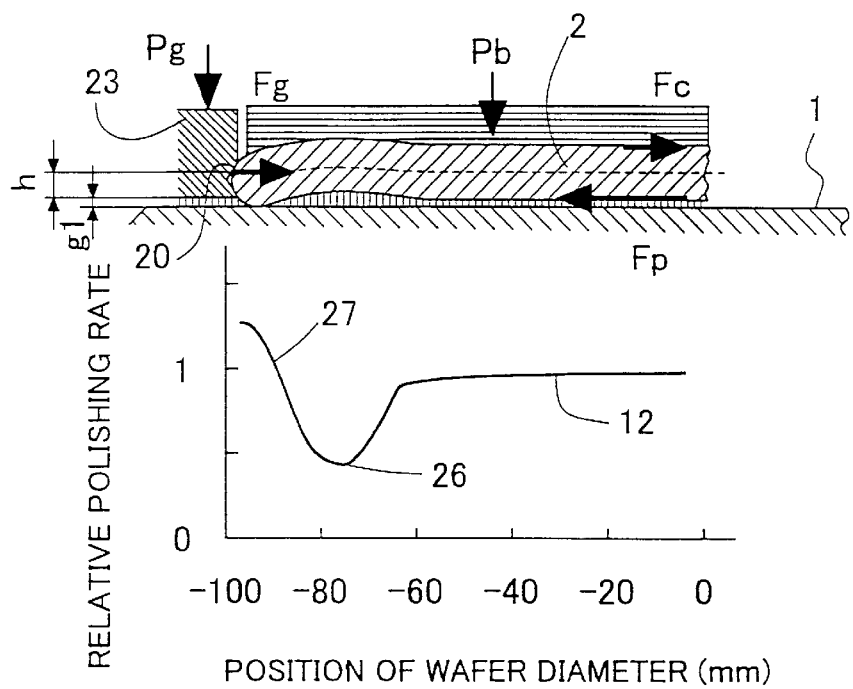
Figure 2B:
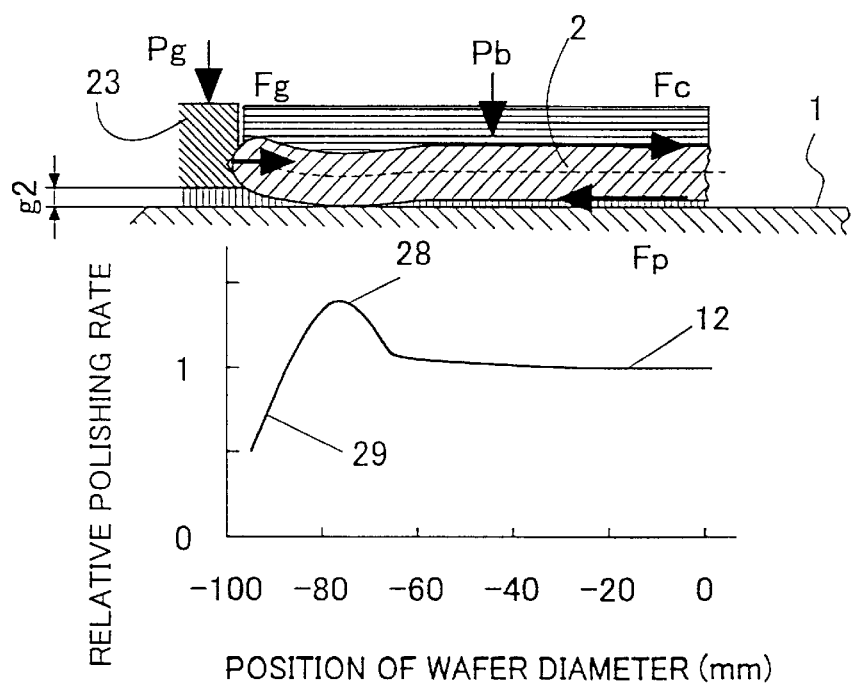

Each of FIGS. 2A and 2B is a schematic view showing the method for polishing the surface of a substrate for a semiconductor device according to the second embodiment of the present invention. A V-shaped groove 20 is circumferentially formed on the lower end of the inner wall of the guide 23. When employing the wafer 2 having a thickness of 730 μm, the center of the groove 20 was positioned at a distance h of 250 μm from the lower surface of the guide 23. The accuracy of the effective center position of the groove from the grindstone surface 1 is more important than the V-shaped opening angle of the groove 20, in that it restricts the height of the outer circumferential end of the wafer having a rounded end. When the inclination of the V-shaped groove is vertically symmetrically formed, the position of the apex of an acute angle at the bottom of the groove becomes the effective center position. This effective center position from the grindstone surface is preferably positioned within a range from 20% to 50% of the thickness of the wafer 2.

Each of FIGS. 2A and 2B shows an example of the cross-sectional shape in the vicinity of the outer circumferential end portion of the wafer and polishing rate properties, when polishing each wafer with the distance being changed between the guide 23 and the grindstone surface 1 to g1 or g2 (g1<g2). The distances g1 and g2 can be controlled by changing the ratio of the wafer load Pb determined by the total pressure to push the wafer 2 against the grindstone surface 1, to the load Pg to push the guide 23 against the grindstone surface 1. The wafer load Pb is the above-described polishing load Pb. As an example of this embodiment, when the average pressure is 350 g/cm$^2$ (about 30 kPa), and the wafer load Pb is 110 kg, FIG. 2A shows the case where the load ratio Pg/Pb is 1.0, and FIG. 2B shows the case where the load ratio Pg/Pb is 0.7. When the load ratio is high as in the case of FIG. 2A, since the height of the outer circumferential end of the wafer 2 approaches the side of grindstone surface, the outer circumferential end of the wafer 2 is deformed in such a manner that it is pushed against the grindstone surface, exhibiting the portion 27 where the polishing rate of the curve is higher than that of the portion 12 of the average polishing rate of the curve, and the portion causing so-called "rebound" due to the reaction of local deformation becomes the portion 26 where the polishing rate of the curve is low accompanying a steep change. As a result, the polishing properties in the vicinity of the outer circumference of the wafer 2 become non-uniform to cause edge sagging phenomenon due to excessive polishing. On the other hand, if the load ratio is low, as in the case of FIG. 2B, since deformation as the outer circumferential end of the wafer 2 is lifted up from the grindstone surface 1, exhibiting the portion 29 where the polishing rate of the curve is lower than that of the portion 12 of the average polishing rate, and the portion causing so-called "rebound" due to the reaction of local deformation becomes the portion 28 where the polishing rate of the curve is high accompanying a steep change, which shows a reverse property as shown in FIG. 2A. As a result, the polishing properties in the vicinity of the outer circumference of the wafer 2 become non-uniform to cause edge sagging phenomenon due to the shortage of polishing.

From the above, the height of the outer circumferential end of the wafer 2 can be controlled by providing a groove on the inner wall of the guide 23 so as to adequately set the load ratio to within a range between the both ratios described above. That is, by setting the conditions to obtain the properties between the values of FIGS. 2A and 2B, edge sagging phenomenon caused by the non-uniformity of polishing properties of the outer circumferential end of the wafer could be reduced.

Embodiment 3

Another embodiment of the present invention will be described below.

Figure 3A:
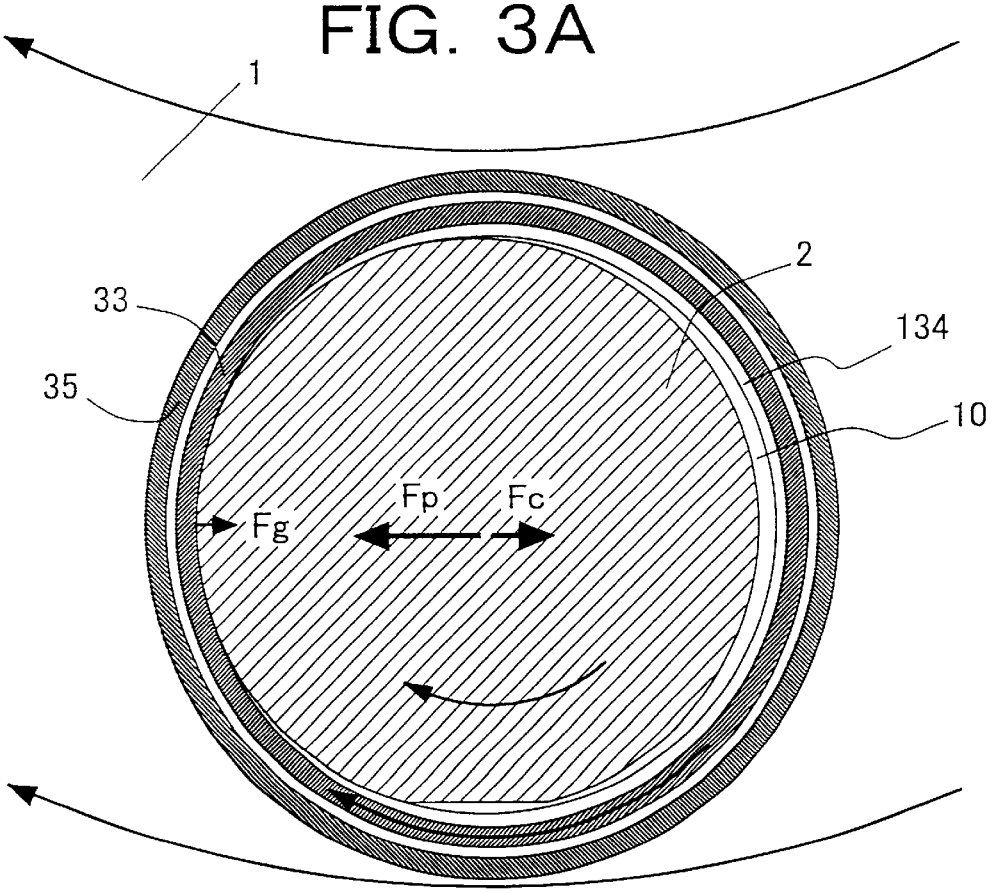
FIG. 3A is a schematic sectional view of a plane of a wafer 2 and a support ring 35 pushed against the surface of grindstone 1.
Figure 3B:
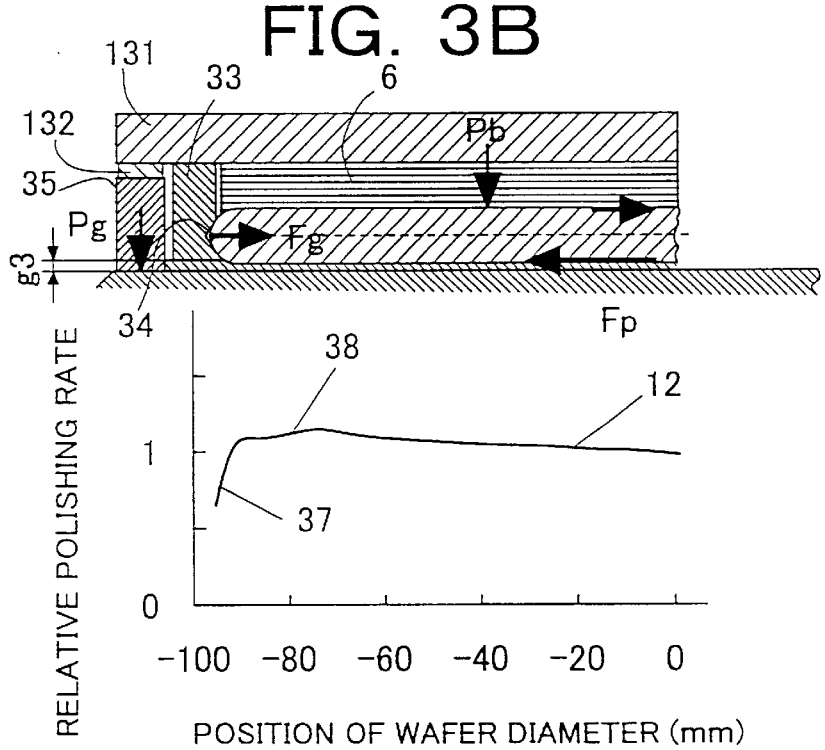

Each of FIGS. 3A and 3B is a schematic view showing the method for polishing the surface of a substrate for a semiconductor device according to the third embodiment of the present invention. A V-shaped groove 34 is circumferentially formed on the lower end of the inner wall of the guide 33 fixed on the holder 131 of the carrier. On the other hand, the holder 131 is provided with a support ring 35 through an adjuster mechanism 132 that can adjust the height. By adjusting the height of the adjuster mechanism 132, the gap g3 between the lower surface of the guide 33 and the grindstone surface 1 can be kept constant. As a result, the support ring 35 that contacts the grindstone surface makes the entire carrier follow the grindstone surface at all times, and keeps the posture of the carrier, that is, the surface of the wafer 2 held by the elastic member 6 fixed to the holder 131, and the guide 33 in a parallel manner and at a constant distance with respect to the grindstone surface. Since the guide 33 does not contact the grindstone, the guide 33 is not worn out, and the supporting conditions of the wafer 2 are kept stable for a long period. Although the portion of the support ring 35 contacting the grindstone is worn out with the progress of polishing, the quantity of wear can be compensated by drawing out the adjuster mechanism 132, the gap g3 can always be kept within the allowable range. This allowable range is determined by the requirement specification of uniformity of the polishing rate, and if the gap g3 is within the allowable range, the adjuster mechanism 132 can be fixed without controlling the draw-out. Alternatively, the quantity of wear of the support ring 35 may be adjusted every predetermined time in the open control system by previously obtaining the relationship between polishing time and the quantity of wear; or by measuring and judging the distance between the surface of the guide 33 and the surface of the support ring 35 with a known measuring device, and controlling the adjuster mechanism 132 so as to adjust the distance to the predetermined value. These adjustments are easily performed during the wafer conveying process to replace the wafer, rather than during the wafer polishing process. Furthermore, the gap g3 is always compensated by placing the guide 33 in contact with a standard surface provided with a reference step by which each height of the surface of the guide 33 and the surface of the support ring 35 become predetermined values, and then the adjuster mechanism 132 is controlled from time to time during the conveying process so as to bring the support ring 35 in contact with the surface of the standard having the step taken into account.

Since the guide 33 is not worn out because it does not contact the grindstone, the effective center height of the V-groove on the inner wall of the guide 33 can always be held constant, and the height of the outer circumferential end of the wafer pushed by thrust generated from the difference between the friction force by polishing and the holding force can be held at a predetermined position stably. Although no gap is made in the downstream side where the wafer is pushed against the groove 34 on the inner wall of the guide 33 by the thrust Fp, an inclined surface 134 of the groove 34 of the inner wall of the guide 33 and the crevice 10 are appeared in the upstream side. Since the top and bottom surfaces of the groove on the inner wall of the guide contact with the arced inclined surface on the outer circumference of the substrate in a sandwiched manner, by restricting the height of the outer circumferential end of the substrate by means of the groove on the inner wall of the guide, the action for increasing the effective contact area is operated to thereby diffuse and relax the concentration of the reaction force from the guide to the substrate, and thus allow for preventing the local deformation of the outer circumferential end of the substrate, the substrate can be polished uniformally up to the outer circumferential end of the substrate to thereby manufacture a semiconductor device without causing edge sagging phenomenon.

In this embodiment, if the load ratio Pg/Pb>1, the support ring can always contact the grindstone surface. The load Pg to the support ring can be set up depending on the external disturbance to affect the load ratio and the polishing load Pb during polishing.

As described above, since the height of the outer circumferential end of the wafer can be controlled stably, there exhibits only the portion 37 where the polishing rate of the curve is a little lower than that of the portion 12 of the average polishing rate, and the portion 38 of gentle variation without the reaction of local deformation, so-called "rebound" is produced, thereby reducing edge sagging phenomenon caused by the non-uniformity of the polishing properties at the outer circumferential end of the wafer.

Embodiment 4

Another embodiment of the present invention will be described below.

Figure 4A:
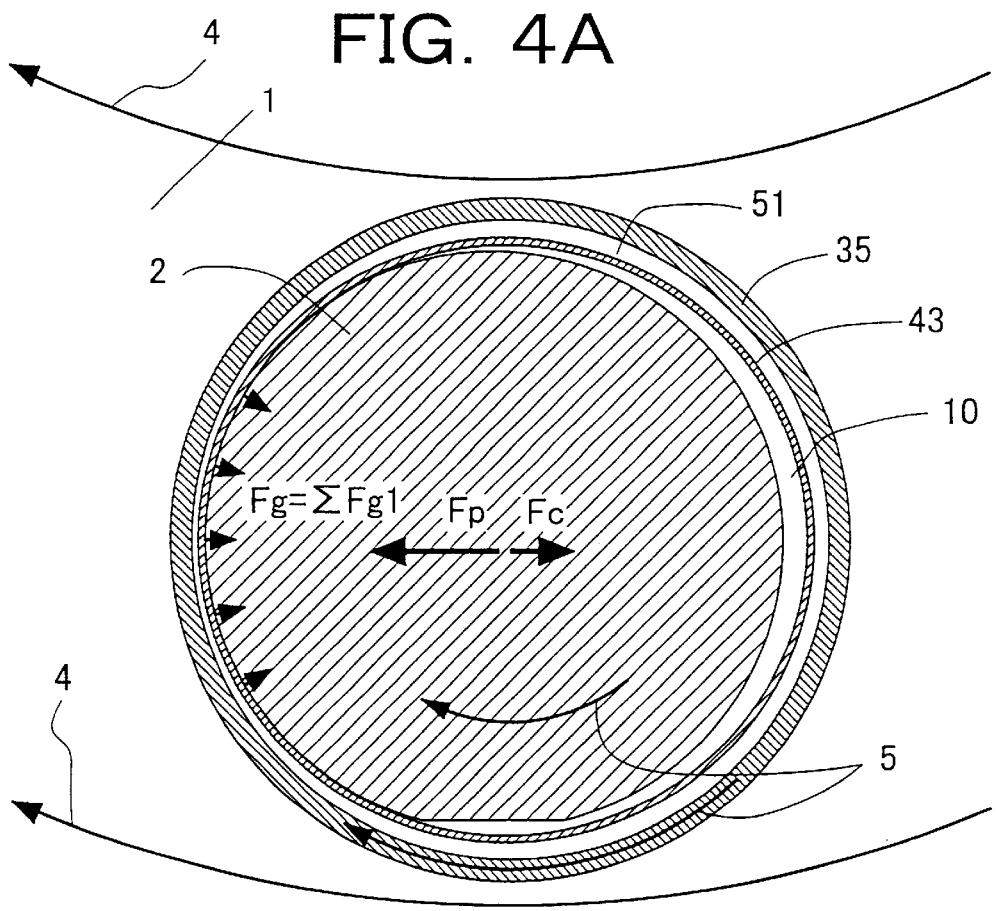
FIG. 4A is a schematic sectional view of a plane of a wafer 42 pushed against a grindstone surface 1, a guide 43, and a support ring 35, when viewed from above.
Figure 4B:
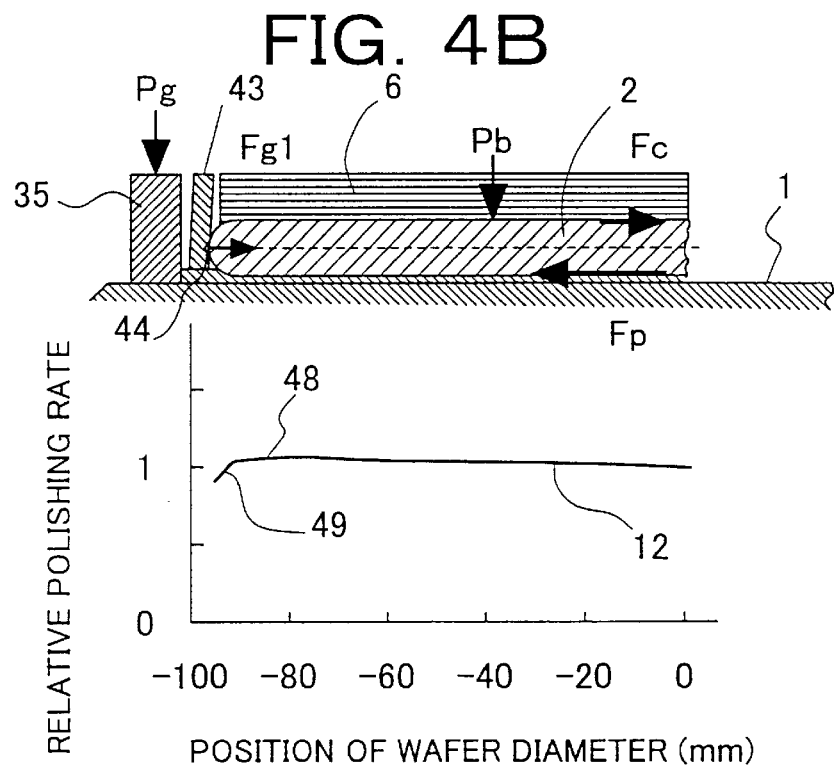

Each of FIGS. 4A and 4B is a schematic sectional view showing the method for manufacturing a semiconductor device according to a fourth embodiment of the present invention.

FIG. 4A is a schematic sectional view of a plane of a wafer 2 pushed against a grindstone surface 1, a guide 43, and a support ring 35, when viewed from above. The grindstone surface 1 rotates in the direction of the arrow 4, and the wafer 2, the guide 43, and the support ring 35 rotate in the direction of the arrow 5. The difference of these two rotations produces the friction force by polishing Fp on the surface of the wafer 2 in accordance with relative movement caused by the rotation of the grindstone surface 1.

FIG. 4B is an enlarged schematic sectional side view, and a graph showing the polishing rate in the vicinity of the outer circumferential end portion on the diameter of the wafer 2. The guide 43 is thin in thickness and has a structure which can be deformed toward the side of the outer region 51, and is circumferentially formed with a V-shaped groove 44 in the lower end of the inner wall. The support ring 35 keeps the gap between the lower surface of the guide 43 and the grindstone surface 1 constant, and further keeps the posture of the carrier in a parallel manner and at a constant distance with respect to the grindstone surface. Since the guide 43 does not contact the grindstone, the load Pg to push the entire carrier against the grindstone surface 1 is applied to the support ring 35. In order to compensate the wear of the support ring due to the contact with the grindstone, a support ring height compensating mechanism (not shown) similar to the mechanism shown in FIGS. 3A and 3B draws out the support ring to accurately compensate the distance between the effective center position of the groove 44 of the guide 43 and the grindstone surface. Since the guide 43 does not contact the grindstone, it is not worn out, and since the effective center position of the v-groove on the inner wall of the guide is always held at a constant position, the height of the outer circumferential end of the wafer pushed by thrust Fp can be stably kept at a constant position.

A polishing load Pb is applied to the back surface of the wafer 2 through an elastic member 6 to push the thin film on the surface of the wafer 2 against the surface of a grindstone 1. A polishing liquid intervenes between the thin film and the grindstone surface 1. The friction force by polishing Fp determined by the product of the friction coefficient $\mu p$ between the thin film on the surface of the wafer and the grindstone surface, and thus the polishing load Pb is generated, and thrust in the rotating direction of the grindstone is applied to the wafer 2. The friction force by polishing Fp applied to the wafer 2 is balanced with the holding force Fc determined by the product of the friction coefficient $\mu w$ between the elastic member 6 and the back surface of the wafer 2, and the polishing load Pb, and the drag Fg from the guide 43.

On the other hand, since the guide 43 has a thin structure in thickness, the thrust generated by the relative motion of the grindstone surface and the wafer pushes the outer circumference of the wafer against the inner wall of the guide, and deforms the inner wall of the guide 43 in accordance with the outer circumference of the wafer. As a result, the contact area of the guide and the outer circumferential end of the wafer is increased, and the drag Fg1 per unit area applied to the outer circumferential end of the wafer is dispersed and decreased as Fg=ΣFg1. As a result, the quantity of deformation in the vicinity of the outer circumferential end of the wafer is reduced, and thus the processing rate characteristic is not influenced by "rebound" caused by the reaction of local deformation, and there is such a feature that there exhibits a gentle change such as a part 48 of the processing rate curve.

Furthermore, since the effective center height of the V-shaped groove 44 on the lower end of the inner wall of the guide 43 is always kept constant, and the height position of the outer circumferential end of the wafer pushed by thrust Fp is stably kept at a constant position during polishing, to stably control the height of the outer circumferential end of the wafer, there exhibits only the portion 49 where the polishing rate of the curve is a little lower than that of the portion 12 of the average polishing rate of the curve, and thus there exhibits the portion 48 of gentle variation without the reaction of local deformation, so-called "rebound", reducing dull edge sagging phenomenon caused by the non-uniformity of the polishing properties at the outer circumferential end of the wafer.

Embodiment 5

Another embodiment of the present invention will be described below.

Figure 5A:
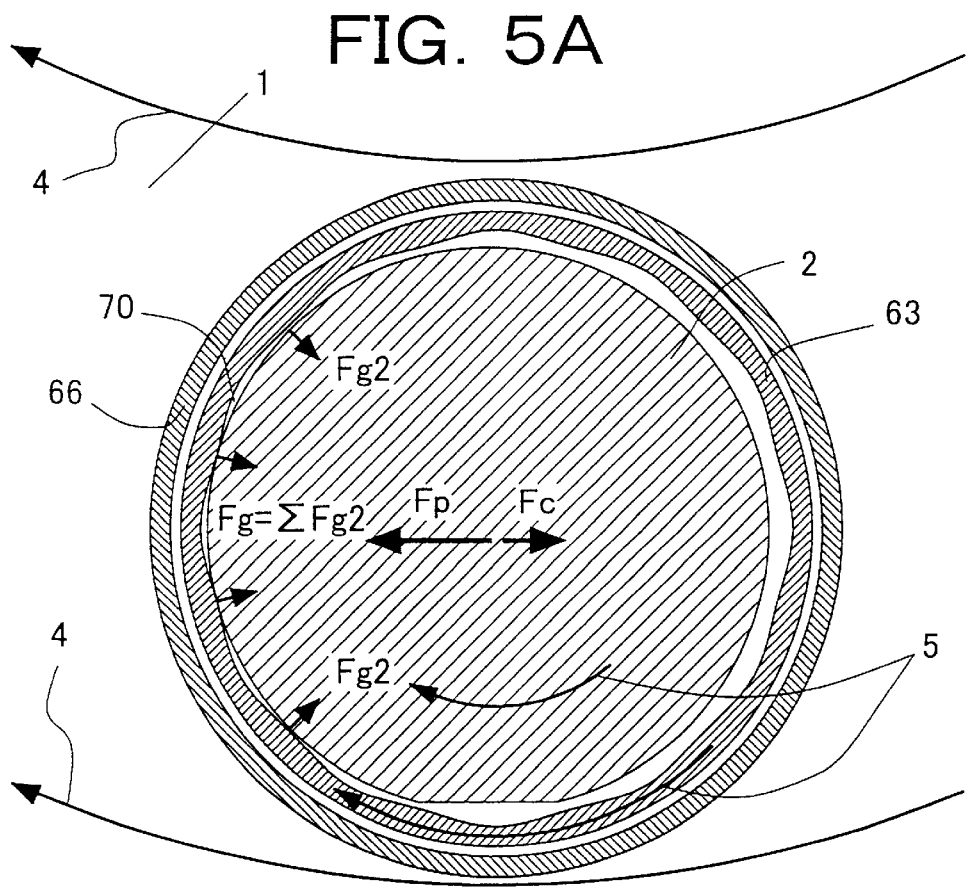
FIG. 5A is a schematic sectional view of a plane of a wafer 2 pushed against a grindstone surface 1, a guide 63, and a support ring 35, when viewed from above.
Figure 5B:
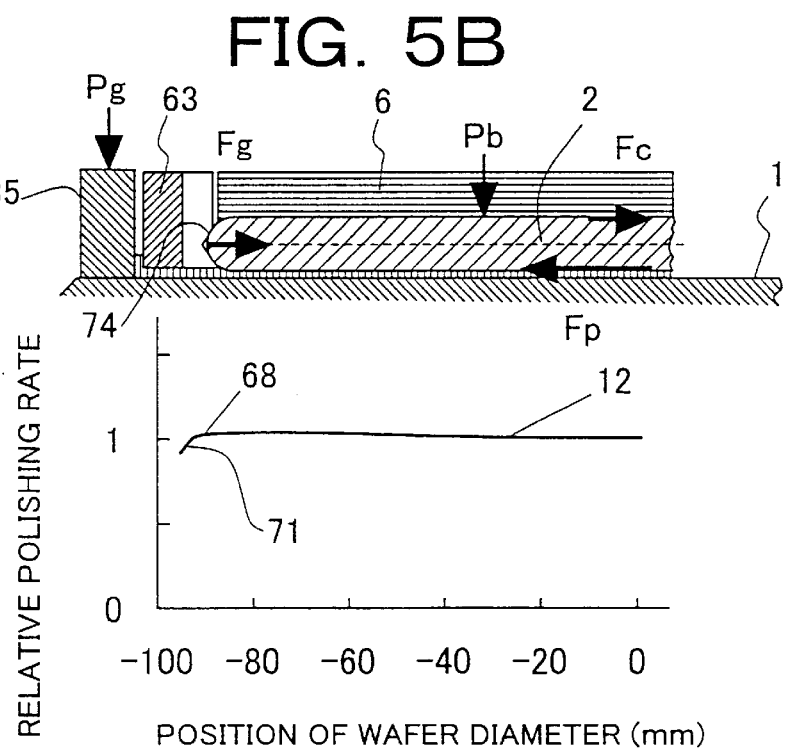

Each of FIGS. 5A and 5B is a schematic sectional view showing the method for manufacturing a semiconductor device according to the fifth embodiment of the present invention.

FIG. 5A is a schematic sectional view of a plane of a wafer 2 pushed against a grindstone surface 1, a guide 63, and a support ring 35, when viewed from above. The grindstone surface 1 rotates in the direction of the arrow 4, and the wafer 2, the guide 63, and the support ring 35 rotate in the direction of the arrow 5 by means of carrier. The difference of these two rotations produces the friction force by polishing Fp on the surface of the wafer 2 in accordance with relative movement caused by the rotation of the grindstone surface 1.

FIG. 5B is an enlarged schematic sectional side view, and a graph showing the polishing rate in the vicinity of the outer circumferential end portion on the diameter of the wafer 2. The guide 63 has clearance 70 partially formed on the inner wall thereof, and a V-shaped groove 74 is circumferentially formed in the lower end of the inner wall. The support ring 35 always guides the wafer so as to contact the grindstone surface 1 to keep the gap between the lower surface of the guide 63 and the grindstone surface 1 constant, and further keeps the posture of the carrier in a parallel manner and at a constant distance. Since the guide 63 does not contact the grindstone, the load Pg to push the entire carrier against the grindstone surface 1 is applied to the support ring 35. In order to compensate the wear of the support ring due to the contact with the grindstone, a support ring height compensating mechanism (not shown) which is similarly as FIG. 3 highly accurately compensates the distance between the effective center position of the groove 74 of the guide 63 and the grindstone surface. Since the guide 63 does not contact the grindstone, it is not worn out, and since the effective center position of the V-groove on the inner wall of the guide is always held at a constant position, the height of the outer circumferential end of the wafer pushed by thrust Fp can be easily and stably kept constant during polishing.

A polishing load Pb is applied to the back surface of the wafer 2 through an elastic member 6 to push the thin film on the surface of the wafer 2 against the surface of a grindstone 1. A polishing liquid intervenes between the thin film and the grindstone surface 1. The friction force by polishing Fp determined by the product of the friction coefficient $\mu p$ between the thin film on the surface of the wafer 2, and thus the polishing load Pb is generated, and thrust in the rotating direction of the grindstone is applied to the wafer 2. The friction force by polishing Fp applied to the wafer 2 is balanced with the holding force Fc determined by the product of the friction coefficient $\mu w$ between the elastic member 6 and the back surface of the wafer 2, and the polishing load Pb, and the drag Fg from the guide 63.

On the other hand, clearances 70 are partially present on the inner wall of the guide 63 at a predetermined distance to control the height position by avoiding contact with the outer circumference of the wafer, and making the outer circumference of the wafer contact the V-shaped grooves provided on the lower portion of the inner wall of the guide other than the clearances at several positions. By supporting the outer circumference of the wafer with two or more inner walls apart from each other, there exists the characteristic of the concentration of drag Fg in a position of the outer circumferential end of the wafer can be prevented, even in the structure body in which the inner wall thickness of the guide 63 is increased and made rigid. That is, since the contact position where the guide contact with the outer circumferential end of the wafer increases, the drag Fg1 applied to the outer circumferential end of the wafer is dispersed and decreased as Fg=Fg2. As a result, the deformation in the vicinity of the outer circumference of the wafer decreases, "rebound" due to the reaction of local deformation does not affect the polishing rate properties, and the polishing rate curve shows gentle variation as the portion 68 of the curve. Furthermore, since the effective center height of the V-shaped groove 74 is always held in the constant position of the lower end of the inner wall of the guide 63, the height position of the outer circumferential end of the wafer pushed by the thrust Fp is stabilized and kept at a constant position during polishing, and the height of the outer circumferential end of the wafer can be controlled stably, there exhibits only the portion 71 where the polishing rate of the curve is a little lower than that of the portion 12 of the average polishing rate of the curve, and the portion 68 of gentle variation without the reaction of local deformation, so-called "rebound" is produced, reducing edge sagging phenomenon caused by the non-uniformity of the polishing properties at the outer circumferential end of the wafer.

The inner wall structure body according to the guide in this embodiment has a shape in which a recess having a radius of 37.5 mm cut to the depth of 3 mm (to the position of a diameter of 208 mm) cut into the inner wall of the guide having an inner diameter of 202 mm to form the clearances 70 at the same interval at 12 positions and can support the wafer in the state where the outer circumferential end of the wafer contacts a plurality of arcs of about 15 mm arranged at a distance of about 53 mm. In order to make contact with the outer circumferential end of the wafer at a plurality of positions, preferably the number of the clearances is at least 8.

Alternatively, the thickness of the wall of the guide 63 may be reduced for the combined use of deflecting deformation effects as in Embodiment 1. By combining the thin inner wall and the support at a plurality of points, the uniform polishing rate can be achieved without reducing the thickness of the inner wall as in Embodiment 1. Furthermore, there also exists the characteristic of a stable carrier structure body that does not cause noise from around the guide capable of being put into practice, by minimizing vibration likely to occur in the thin inner wall structure as in Embodiment 1, and changing the vibration mode by the difference of thickness.

Embodiment 6

Another embodiment of the present invention will be described below.

Figure 6A:
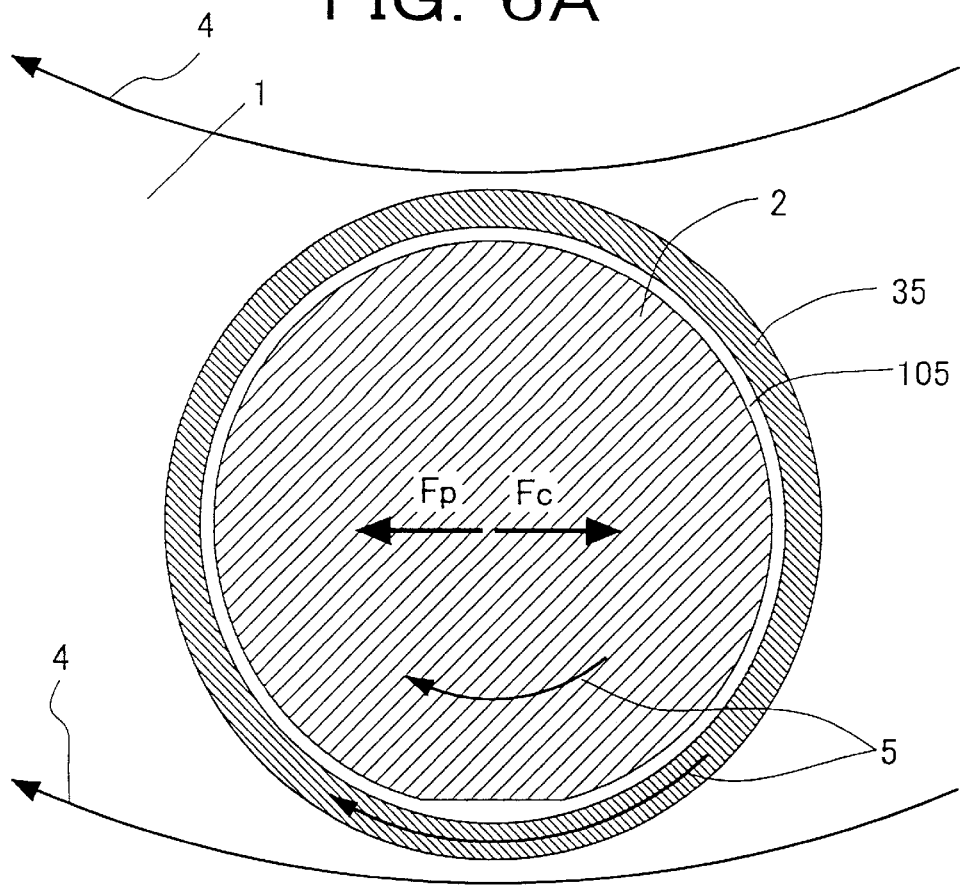
FIG. 6A is a schematic sectional view of a plane of a wafer 2 pushed against a grindstone surface 1 and a support ring 35, when viewed from above.
Figure 6B:
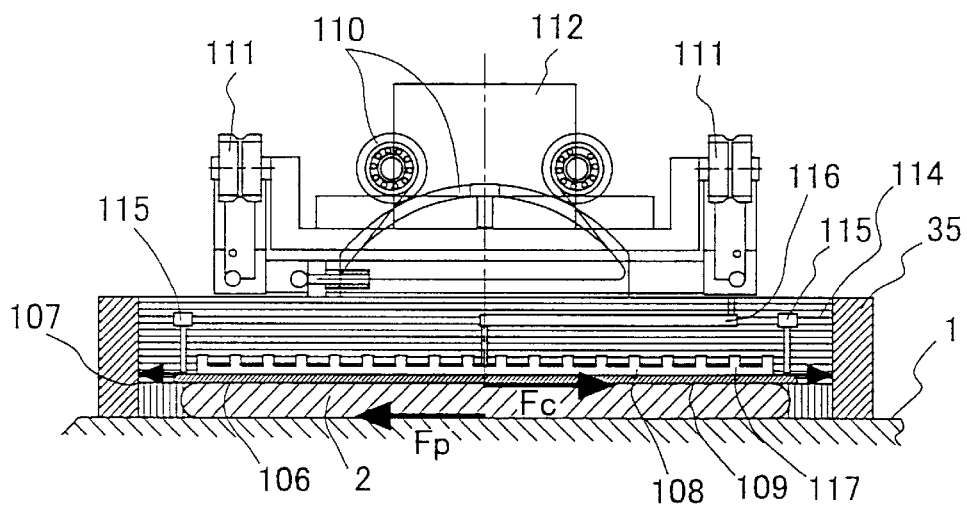
FIG. 6B is an enlarged schematic sectional side view during polishing the wafer 2 held by the carrier against the grindstone surface.
Figure 7:
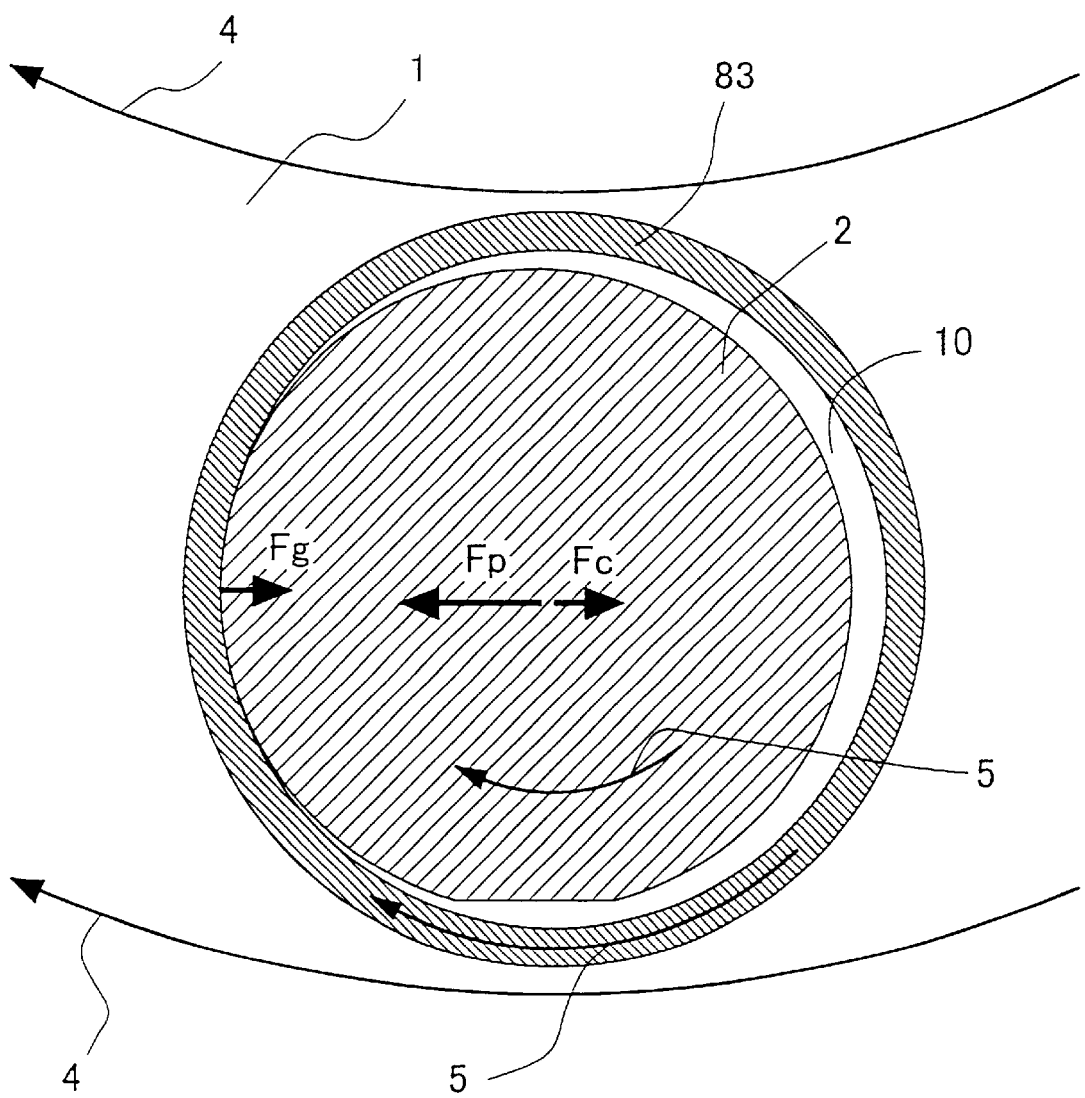
FIG. 7 is a schematic view showing the method for polishing the surface of a substrate for a semiconductor device according to a prior art technique; wherein this
Figure 8A:
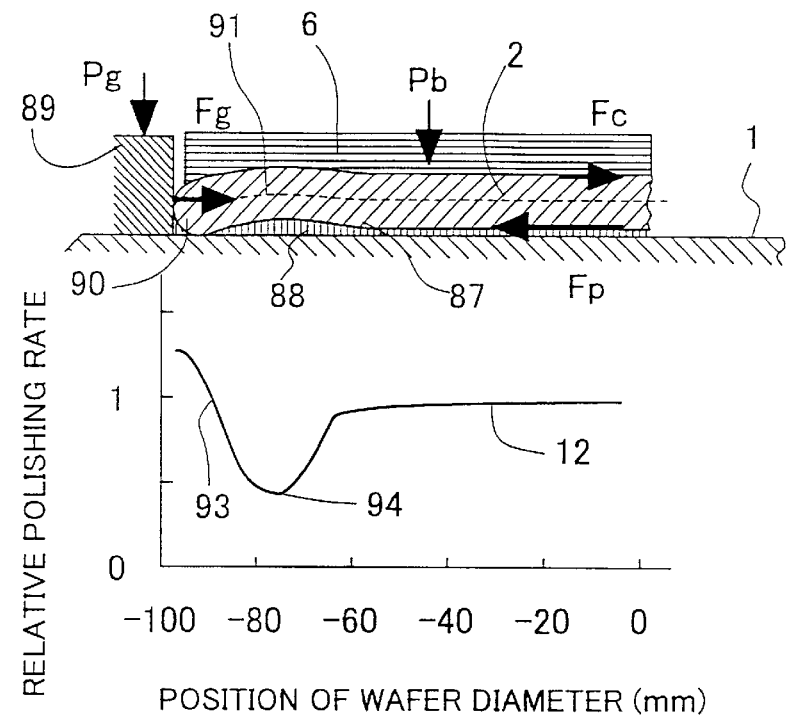
FIG. 8A shows the case where the outer circumferential end portion 90 of the wafer has been deformed in such a way that it is pushed against the surface of the grindstone.
Figure 8B:
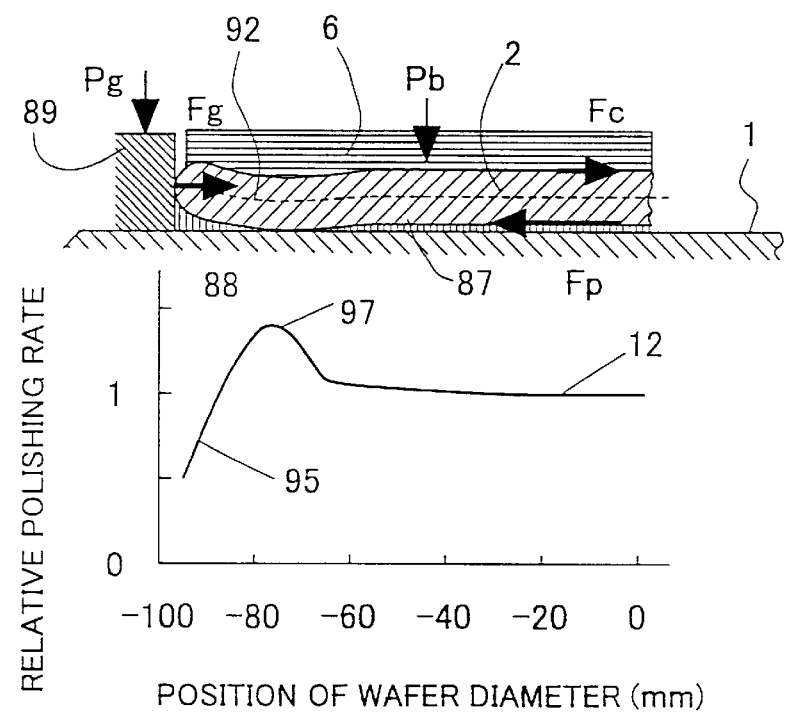
FIG. 8B shows the case where the outer circumferential end portion 90 of the wafer has been deformed in such a way that it is lifted up from the surface of the grindstone, FIGS. 9A to 9G each being a schematic sectional view showing the method for polishing the surface of a substrate for a semiconductor device according to a seventh embodiment of the present invention, FIGS. 10A to 10E each being a schematic perspective sectional view showing the method for polishing the surface of a substrate for a semiconductor device according to an eighth embodiment of the present invention, and FIGS. 11A to 11G each being a schematic sectional view showing the method for polishing the surface of a substrate for a semiconductor device according to a ninth embodiment of the present invention.

Each of FIGS. 6A and 6B is a schematic sectional view showing the method for manufacturing a semiconductor device according to a sixth embodiment of the present invention.

FIG. 6A is a schematic sectional view of a plane of a wafer 2 pushed against a grindstone surface 1 and a support ring 35 under, viewed from above. The grindstone surface 1, the wafer 2, and the support ring 35 rotate in the direction of the arrow 4 by means of the carrier. The carrier mainly comprises a driving shaft 112, a gimbals mechanism, and a holder 114. The relative motion due to the rotation of the grindstone surface, the wafer, or the like produces the friction force by polishing Fp on the surface of the wafer 2.

FIG. 6B is an enlarged schematic sectional side view during polishing the wafer 2 held by the carrier against the grindstone surface. The gimbals mechanism exemplified in FIGS. 18 and 19 of JP-A-11-163103 specification. This is composed of rolling restraining means 110 and 111, which enables the carrier holding the wafer to perform the spherical motion in which the boundary surface where the wafer contacts the grindstone surface as a center of rotation. The rolling restraining means 110 enables the carrier to rotate around the axis vertical to the paper with an arced member provided on the holder, a bearing contacting the arced member, and a restraining means of a wound material such as a steel belt. Similarly, the rolling restraining means 111 enables the carrier to rotate around the axis parallel to the paper. Also, each of arced members and bearings enables spherical motion by the precession of a high straining rigidity without mechanical play by applying tension to the wound material. Since the center position of the rotation of the spherical motion is determined by the center position of the arc of the arced member, the center position of the rotation of the spherical motion can be optionally designed by adjusting the radius and the installing position. Therefore, the optimum structural conditions of the spherical motion in polishing can be established easily.

A thin plate 106 that has a mechanism to suck the back surface of the wafer 2 fixes and holds the wafer 2, and a predetermined pressure is introduced to the back surface of the thin plate 106 to apply the polishing load Pb. The thin plate 106 may be of a stainless-steel or plastic thin plate of a thickness of 0.1 to 0.3 mm, and is fixed on the holder 114 in the state where a predetermined tension is applied using a tension mechanism 107 of a structure body to uniformly wind the outer circumference of the thin plate in the radial direction.

A visco-elastic member of a flexible rubber or plastics of a thickness of not more than 1 mm is flatly formed on the surface of the thin plate 106 (the side to contact the back surface of the wafer), and sucks and fixes the back surface of the wafer by communicating with a plurality of through holes of a diameter of not more than 2 mm formed on the thin plate 106.

The back surface of the thin film 106 has discharge channels 109 connected to the plurality of through holes. The backside of the channels 109 is sealed tightly with a flexible rubber or plastic sheet, and has pressurized spaces 117 that can independently supply air. The channels 109 may be a flexible rubber for performing tight sealing or a plastic sheet that has a plurality of grooves formed on the surface of resin, or may be a structure that has a flexible net intervening between the thin plate and the sheet for performing tight sealing. The channels 109 are connected to a pipe 115 with flexible airtight means, and can be evacuated with an exhaust system (not shown). The pressurized spaces 117 are connected to a pipe 116, and can apply polishing load to the wafer 2 through the thin plate 106 by pressurizing from the air-supply system (not shown).

The gimbals mechanism of the carrier makes possible the precession of the holder 114, and by applying load so that the support ring 35 always contacts the grindstone surface 1, the posture of the holder 114 can always be held in a parallel manner to the grindstone surface 1. In this embodiment, since the back surface of the wafer can be sucked to fixedly secure to the visco-elastic member of the thin plate 106, the friction coefficient $\mu w$ between the back surface of the wafer and the visco-elastic member becomes larger than the friction coefficient $\mu p$ between the thin film on the surface of the wafer and the grindstone surface ($\mu w > \mu p$).

Therefore, the friction force by polishing Fp determined by the product of the friction coefficient $\mu p$ between the thin film on the surface of the wafer and the grindstone surface, and polishing load Pb (Fp=Pb ×$\mu p$), polishing friction force Fp acting on this wafer does not exceed the holding force Fc determined by the product of the friction coefficient $\mu w$ between the elastic member and the back surface of the wafer, and the polishing load Pb (Fc=Pb×$\mu w$), and the friction force by polishing is always equal to the holding force (Fp=Fc). As a result, a region 105 is maintained between the outer circumference of the wafer and the inner wall surface of the support ring, where they do not contact each other, and since the thrust to push the wafer against the support ring is not almost generated even if the wafer is eccentrically mounted, the drag Fg generated in the outer circumference of the wafer is almost zero, and there exists characteristic that the outer circumferential end of the wafer is not affected by the non-uniformity of the polishing rate due to the drag.

Alternatively, the use of a rubber sheet having fine grooves formed on the surface in a lattice-like manner to contact the back surface of the wafer, in place of a stainless steel or plastic thin plate coated with a visco-elastic member made of such as a flexible rubber and plastics, can increase the friction coefficient with the back surface of the wafer to thereby increase the holding force of the wafer.

If only a rubber sheet is used, the application of pressure to the rubber sheet, instead of sucking with a negative pressure, can make the rubber sheet follow the back surface of the wafer to thereby produce the holding force.

Especially, in order to increase the holding force of the rubber sheet sucked on the back surface of the wafer, employing design in which the inner diameter of the guide or the support ring surrounding the wafer is adapted to be a few millimeters larger than the diameter of the wafer leads to enabling the rubber sheet sucked the wafer to expand and contract horizontally, that is, in the direction of the grindstone surface, thereby enabling thrust caused by polishing friction force to be relieved by a stretch deformation of the rubber, and consequently, the holding force of the rubber sheet is enhanced to reduce the drag to the outer circumstance of the wafer.

The rubber sheet may be a sheet of a synthetic rubber, such as ethylene-propylene rubber (EPDM), or a silicone rubber sheet of a thickness of 0.5 to 1.5 mm. Also, in order to obtain the suction force with the back surface of the wafer, the hardness of the rubber of JIS A 30 to 70 degrees is preferable.

In the case of a rubber material, the material may be vulcanizingly molded into the shape of a bag, balloon, or tire that can be fitted into a holder of a suitable shape. Assembling is easy if a tension caused by a stretch of 2 to 10% is imparted to a vulcanizingly molded rubber pod, to thereby fit the pod into the holder.

When the rubber pod stretched by imparting tension sucks the wafer and expands and contracts in the horizontal direction, in order to prevent the outer circumferential portion of the rubber pod from moving in the gap between the portion and the back surface of the wafer, and becoming the cause of the non-uniformity of polishing load distribution, the rounded structure avoiding the portions of an acute angle such as the right angle is preferable.

When a rubber pod is used, in order to automate the suction of the wafer to the carrier, a through hole may be formed in the vicinity of the center of the rubber pod to suck the wafer with a negative pressure from the pressurizing chamber behind the rubber pod, to make the structure to which the wafer is able to mount. The pressure can be easily applied to the back surface of the rubber pod to impart polishing load to the wafer, by feeding the air into the pressurizing chamber after the wafer has been conveyed on the grindstone surface and the carrier has been lowered to contact the grindstone, in the state where the wafer is sucked to the carrier. In the pressurized state, since the through hole of the rubber pod is pushed against the back surface of the wafer and closed, the gas does not leak.

Also, since the adequate flexibility is required in the peripheral area to which the holder of the rubber pod is mounted, in order to apply uniform polishing load, cloth such as nylon or polyester may be integrally molded, in the center region other than the peripheral portions of the rubber pod or the hardness or the thickness of the rubber may be changed, for improving the durability of the rubber pod or avoiding excessive expansion. For example, it is preferable that the outer diameter of the rubber pod is designed to be 2 to 10 mm smaller than the diameter of the wafer, and the diameter of the center region is designed to be 2 to 50 mm smaller than the diameter of the wafer.

Alternatively, the flow rate of the polishing liquid intervening between the wafer and the polishing means may be controlled by controlling the pressure of the pressurized fluid to the pressurized spaces 117 whenever necessary so as to control the gap where the polishing liquid intervenes sandwiched by the wafer 2 and the grindstone surface 1 of the polishing means within a range of not more than 2 μm as required, to eliminate the cause of instability of the polishing rate, such as pressure rise or sucking due to dynamic pressure during polishing, and to prevent the occurrence of defects such as scratches by accelerating the discharge of polishing debris. Thus, the control of the gap between the wafer and the polishing means is important.

It is also possible to monitor the flatness of the surface of the wafer with an interference flatness measuring device using laser beams before allowing the wafer to approach the polishing means, and controlling and keeping the carrier to a desired shape based on the monitor information of the flatness of the wafer surface, to allow the wafer to approach the polishing means for polishing. Since small non-uniformity of not more than 1 μm in the circumferential direction can be compensated by the monitor beforehand, only the protrusions of the functional members of the semiconductor device formed on the surface of the substrate can be polished highly accurately using a hard grindstone without being affected by small non-uniformity of not more than 1 μm inherent to the wafer. The monitor information of the flatness of the wafer can also be converted from the values of friction force or driving force during polishing.

Furthermore, it is possible to control and maintain the pressurizing conditions of the pressurized spaces so that the entire wafer has a substantially convex spherical surface of the center portion of up to 2 μm, and to change the tilt angle of the axis of precession to control the posture and polish, for reducing edge sagging phenomenon caused by the non-uniformity of the polishing properties at the outer circumferential end of the wafer.

Embodiment 7

Each of FIGS. 9A to 9G is a schematic sectional view showing the method for polishing the surface of a substrate for a semiconductor device according to the seventh embodiment of the present invention. Normally, the functions of a semiconductor device such as a DRAM are formed by repeating the formation of steps in a semiconductor substrate, the formation of wells, isolation, the formation of transistors, the formation of bit lines, the formation of capacitors, and the formation of wiring. These processes include exposure, etching, heat treatment (oxidation, annealing, diffusion), ion implantation, thin films forming treatment (CVD, sputtering, evaporation), cleaning (resist removal, cleaning by solution), testing and the like. These processes are suitably combined.

Each of FIGS. 9A to 9G shows an example of the formation of bit lines and capacitors among the process for manufacturing a DRAM, and especially shows a schematic sectional view in a process or processes in which the element structure is (are) changed. The right-hand views show the cross-sectional structures of a memory cell portion, and the left-hand views show the cross-sectional structures of a peripheral CMOS portion. The manufacturing process proceeds form FIG. 9A to FIG. 9G.

Figure 9A:
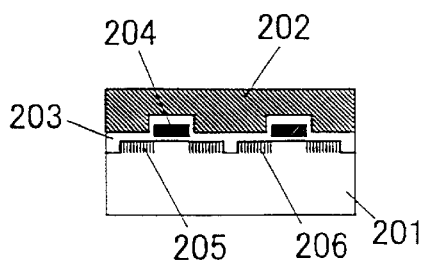
Figure 9A:
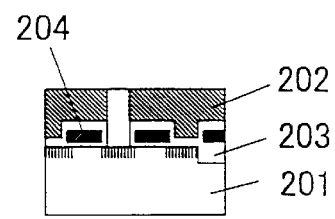

First, a groove for isolating elements is formed on a semiconductor substrate 201. Thereafter, a silicon oxide film is formed on the substrate having the groove using the chemical gas-phase growth. Next, the surface of this silicon oxide film is polished using the method for manufacturing a semiconductor device shown in any one of Embodiments 1 to 6, and the silicon oxide film is embedded in the groove. Thereafter, a gate oxide film and gate electrode 204, and an impurity-doped layer to be a source or drain are formed. Furthermore, a silicon oxide film is formed. A resist film 202 is formed on this silicon oxide film, and exposed to form a resist pattern having an opening on the impurity-doped layer to be a source region in the memory cell portion. The silicon oxide film on the impurity-doped layer in the memory cell is etched off using this resist pattern as a mask (FIG. 9A).

Figure 9B:
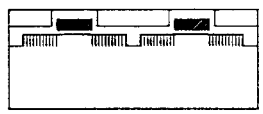
Figure 9B:
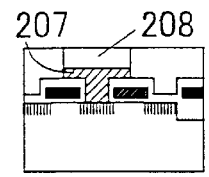
Figure 9C:
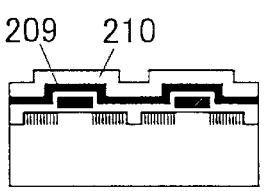
Figure 9C:
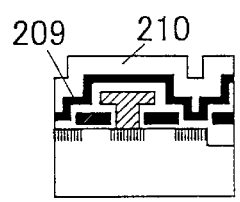
Figure 9D:
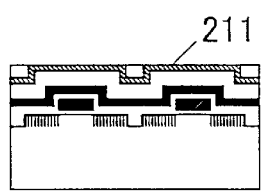
Figure 9D:
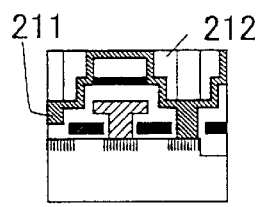
Figure 9E:
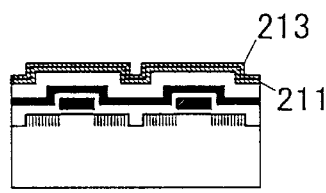
Figure 9E:
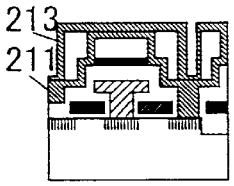
Figure 9F:
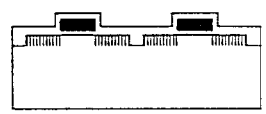
Figure 9F:
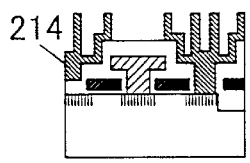
Figure 9G:
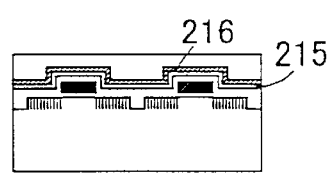
Figure 9G:
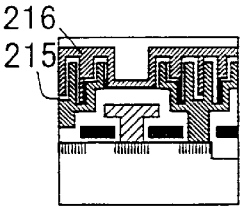

Next, after removing the resist film 202, a polycrystalline silicon film and a silicon oxide film are formed, and processed to form a bit line (FIG. 9B). Next, a silicon oxide film, a silicon nitride film 209, and a silicon oxide film 210 are deposited (FIG. 9C). Thereafter, an opening is formed in the insulating film on the impurity-doped layer to be a drain in the memory cell, using lithography and dry etching, and then a polycrystalline silicon film 211 to be a first lower electrode of an accumulation capacitor (accumulation electrode) is formed. Furthermore, a silicon oxide film 212 having an opening is formed on the polycrystalline silicon film on the impurity-doped layer to be a drain (FIG. 9D). Thereafter, a polycrystalline silicon film to be a second lower electrode of an accumulation capacitor (inside the first lower electrode) is formed (FIG. 9E). Next, the polycrystalline silicon film on the top surface is removed, and the silicon oxide film 212 and the silicon nitride film 209 are removed (FIG. 9F). Thereafter, a tantalate oxide film ($Ta_2O_5$ film) 215 (capacitor insulating film), a tungsten film (W film) 216 to be the upper electrode of an accumulating capacitor, or a polycrystalline silicon film is formed (FIG. 9G).

The reference numerals as shown in FIGS. 9A–9G are as follows: 201 . . . semiconductor substrate, 202 . . . resist film, 203 ... $SiO_2$ film (passivation film), 204 ... $Si_3N_4$ film, 205 ... n+ layer, 206 ... P+ layer, 207 ... poly-Si (polycide) film, 208 ... $SiO_2$ film, 209 ... $Si_3N_4$ film, 210 ... $SiO_2$ film, 211 ... poly-Si film, 212 ... $SiO_2$ film, 213, 214 ... poly-Si films, 215 ... $Ta_2O_5$ film, and 216 ... W (poly-Si) film.

By processing according to any one of methods for polishing surface of semiconductor device substrate of Embodiments 1 to 6, and performing the exposure process using exposure equipment without alignment error, prior to deposition of the $SiO_2$ films, deposition of the poly-Si films, deposition of the $Si_3N_4$ films, etching of the poly-Si films, etching of the $SiO_2$ films, etching of the $Si_3N_4$ films, formation of the $Ta_2O_5$ film, and formation of the W film, a semiconductor device characterized by high performance and high reliability can be provided easily. In chemical mechanical polishing of the $SiO_2$ film (passivation film) or the like, if the polishing atmosphere such as the polishing liquid, is made alkaline, and the surface of the thin film on the semiconductor substrate to be polished is chemically activated before mechanical polishing, the polishing efficiency is drastically improved.

Furthermore, if water, to which 0.1 to 10% by weight of a dispersant is added, is used as the polishing liquid, the dispersion of abrasive grains is accelerated, and polishing rate and uniformity can be improved. The dispersants include an anionic dispersant using a special polycarboxylic acid ammonium salt (TU-100 manufactured by Kao Corp.) or the like.

Alternatively, the use of slurry, to which 0.1 to 10% by weight of abrasive grains are added, improves the concentration of the abrasive grains, and enhances the polishing rate and uniformity.

Embodiment 8

FIG. 10 is a schematic perspective sectional view showing the method for polishing the surface of a substrate for a semiconductor device according to the eighth embodiment of the present invention. An interlayer insulating film 221 such as an $SiO_2$ film and the like of a thickness corresponding to the wiring layer is deposited on a planarized semiconductor substrate using any one of methods for polishing a surface of semiconductor device substrate of Embodiments 1 to 6. Transistors are formed on the semiconductor substrate. Furthermore, an etch stop layer 220 such as an SiN film and the like is deposited to increase the accuracy of etching depth control of the wiring groove (FIG. 10A). After resist film application treatment of 222 is accomplished, the semiconductor substrate is placed on the fixing table of the present invention, and the wiring groove pattern is exposed and transferred thereon (FIG. 10B). After the resist is developed, etching is performed using the residual resist film as a mask to form the wiring-forming region 223 (FIG. 10C). A resist film 224 is applied again onto the semiconductor substrate; the semiconductor substrate is placed on the fixing table of the present invention; and the connecting-hole pattern is exposed and transferred thereon. After the resist is developed, etching is performed using the residual resist film as a mask to form the connecting holes 225 (FIG. 10D). After removing the resist film, a metal such as W or Cu and the like is embedded, and the surface of the substrate is planarized with chemical mechanical polishing of the present invention to form wirings 226 and wiring plugs 227 to be connected to the wirings of the under layer (not shown) (FIG. 10E). By repeating the above-described processes as required, a semiconductor device having fine multiple wiring layers can be manufactured highly accurately and easily.

Figure 10A:
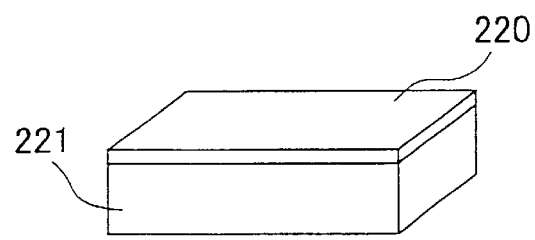
Figure 10B:
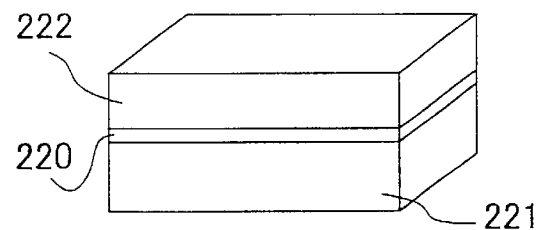
Figure 10C:
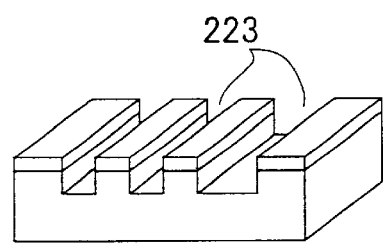
Figure 10D:
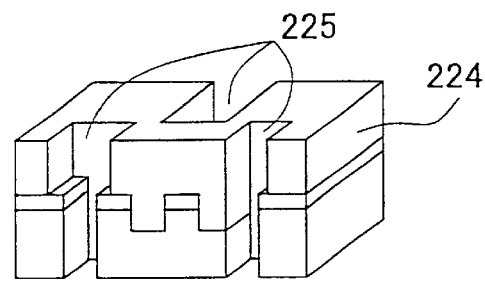
Figure 10E:
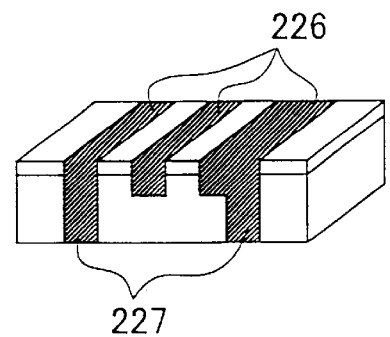
Figure 11A:
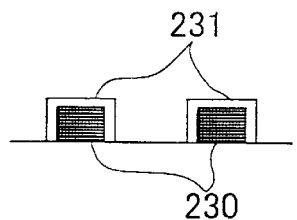
Figure 11B:
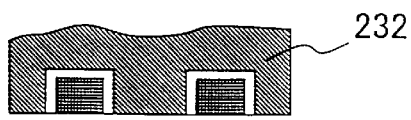
Figure 11C:
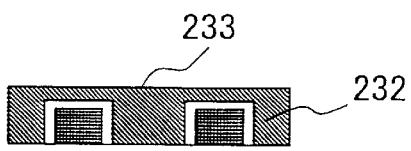
Figure 11D:
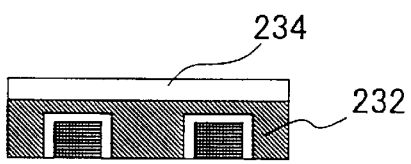
Figure 11E:
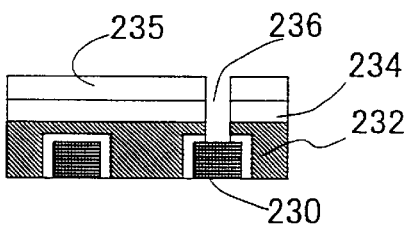
Figure 11F:
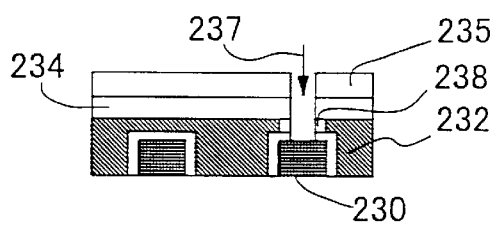
Figure 11G:
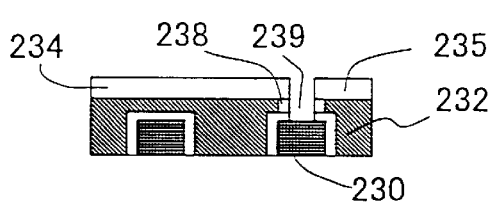

In the chemical mechanical polishing of a metal as shown in FIG. 10D, if the polishing atmosphere, such as the polishing liquid, is made acidic, and the surface to be polished of the thin metal film on the semiconductor substrate is chemically corroded and mechanically polished, the polishing efficiency is drastically improved. As the oxidant, hydrogen peroxide or iron nitrate can be used. Also as the abrasive grains, $Al_2O_3$, $MnO_2$ or the like can be used. Furthermore, for controlling the accomplishing point of polishing utilizing chemical selectivity, the combined use of an antioxidant such as BTA and the like is also effective.

Embodiment 9

FIG. 11 is a schematic sectional view showing the method for polishing the surface of a substrate for a semiconductor device according to the ninth embodiment of the present invention. This is the process to use an organic SOG film as one of low-dielectric-constant insulating films for decreasing the capacity between wirings. Metal wirings 230 such as Al and the like are formed on a semiconductor substrate, and an oxide film 231 such as $SiO_2$ and the like is formed as the base covering film (FIG. 11A). An organic SOG film 232 is applied (FIG. 11B). The surface of the substrate is planarized by the process of the method for polishing the surface of a substrate for a semiconductor device of any one of Embodiments 1 to 6 of the present invention to form a flat surface 233 (FIG. 11C). A cap oxide film 234 is formed for imparting resistance to oxygen plasma (FIG. 11D). After resist film 235 is applied, the semiconductor substrate is placed on the fixing table of the present invention, and the connecting-hole pattern is exposed and transferred on the semiconductor substrate. After the resist film is developed, etching is performed using the residual resist film as a mask to form the connecting holes 236 (FIG. 11E). Thereafter, low-pressure oxygen RIE 237 treatment is performed to form an oxide layer 238 of a thickness of 10 nm on the surface of a bore 239 as a hole of the organic SOG layer under the connecting holes 236 (FIG. 11F). Thereafter, the resist film 235 is removed, and after filling the bore 239 with a metal, the surface of the substrate is planarized by the process of the method for polishing the surface of a substrate for a semiconductor device of any one of Embodiments 1 to 6 of the present invention (FIG. 11G). Since the organic SOG film is covered with the oxide film 234 and the oxide layer 238, the organic SOG film can resist oxygen plasma treatment. Furthermore, since the organic SOG film has the effect of the stopper in planarizing using chemical mechanical polishing, the accuracy of planarizing is improved. As a result, a semiconductor device of higher performance can be manufactured easily.

As shown in Embodiments 7 to 9, as the result of polishing the surface of a substrate for a semiconductor device according to the present invention, the yield at the outer circumference of the wafer is improved, and the yield (acquisition rate) of the semiconductor devices is improved by about 20%.

According to the method for polishing the surface of a substrate for a semiconductor device of the present invention, as described above, since the occurrence of non-uniformity of polishing properties on the surface of the outer circumference of the substrate is prevented, the thin film formed on the surface of the substrate can be polished flatly without causing so-called edge sagging phenomenon, and only the protruded portion of the thin film can be planarized without polishing the recessed portion of the thin film corresponding to the pattern, semiconductors of high-performance can be manufactured at a high yield, and can be provided at low costs.

What is claimed is:

1. A method for polishing the surface of a semiconductor device substrate, comprising the steps of:

providing a substrate having a thin film on the surface thereof;

holding the back surface of said substrate with a substrate-holding carrier installed in a polishing equipment; and polishing said substrate so that the reaction force to said substrate generated when said substrate is pushed against an inner guide provided so as to surround said substrate for preventing said substrate from deviating from said carrier due to a friction force generated by the relative movement between said substrate and a polishing member provided on said polishing equipment, is dispersed, when said substrate is rotated while being integrated with said carrier while holding said substrate, and pushing said substrate against said polishing member provided in said polishing equipment, wherein an outer guide is provided outside of the inner guide in said carrier for keeping said carrier at a distance from said polishing member.

2. A method for polishing the surface of a semiconductor device substrate, comprising the steps of:

providing a semiconductor substrate having a thin insulating film on the surface thereof;

holding the back surface of said semiconductor; and polishing said substrate in the state where the back surface of said semiconductor substrate is held, using a polishing member that has a different diameter and a different center location from the diameter and center location of said semiconductor substrate, while preventing said semiconductor substrate from moving laterally with an inner guide provided around said semiconductor substrate and made of an elastic material, wherein an outer guide is provided outside of the inner guide in said carrier for keeping said carrier at a distance from said polishing member.

3. The method for polishing the surface of a semiconductor device substrate according to claim 1, wherein, said inner guide has a recessed groove on the inner surface thereof, and a constant distance is maintained between said polishing member and said recessed groove.

4. The method for polishing the surface of a semiconductor device substrate according to claim 3, wherein said inner guide is alternately provided with relief regions where said recessed groove does not contact said substrate.

5. The method for polishing the surface of a semiconductor device substrate according to claim 3, wherein said inner guide has a deflection-deformable structure.

6. A method for polishing the surface of a semiconductor device substrate, comprising the steps of:

providing a substrate having a thin film on the surface thereof;

pushing the surface of said substrate against the surface of a polishing member by applying pressure to the back surface of said substrate; and polishing said thin film using said polishing member, while preventing said substrate from moving laterally caused by the friction force generated between said substrate and said polishing member with an inner guide that has recess at the location to contact with said substrate, and is provided so as to surround said substrate, wherein an outer guide is provided outside of the inner guide in said carrier for keeping said carrier at a distance from said polishing member.

7. The method for polishing the surface of a semiconductor device substrate according to claim 6, wherein said recess has a V-groove shape.

8. The method for polishing the surface of a semiconductor device substrate according to claim 1, wherein the modulus of longitudinal elasticity of said polishing member in the polishing surface side is not less than 3,000 kg/cm$^2$.

9. The method for polishing the surface of a semiconductor device substrate according to claim 1, wherein said polishing member is a fixed grinding machine on which grinding grains are fixed.

10. The method for polishing the surface of a semiconductor device substrate according to claim 1, wherein said substrate is polished while supplying water that contains a dispersant on the surface of said polishing member.

11. The method for polishing the surface of a semiconductor device substrate according to claim 1, wherein said substrate is polished while supplying slurry that contains grinding grains on the surface of said polishing member.

12. The method for polishing the surface of a semiconductor device substrate according to claim 1, wherein said polishing is performed while controlling said carrier based on the monitor information of the flatness of said substrate.

13. The method for polishing the surface of a semiconductor device substrate according to claim 1, further comprising the step of controlling a quantity of the processing liquid intervening between said thin film and said polishing member by controlling the distance between said thin film and said polishing member.

14. The method for polishing the surface of a semiconductor device substrate according to claim 1, wherein said thin film is a thin organic SOG film.

15. The method for polishing the surface of a semiconductor device substrate according to claim 1, wherein said semiconductor device is provided with a capacitor for storing electric charge, and a transistor for supplying to or extracting from said capacitor.

16. A method for polishing the surface of a semiconductor device substrate, comprising the steps of:

providing a substrate having a thin film on the surface thereof;

holding said substrate with a carrier comprising an inner guide that has an inner dimension larger than the outer dimension of said substrate, an outer guide that is provided outside of said inner guide in said carrier for keeping said carrier at a distance from a polishing member and an elastic member that can hold the back surface of said substrate inside said inner guide;

thereafter pushing a surface of said substrate against a surface of said polishing member by applying pressure to the back surface of said substrate through said elastic member; and polishing the thin film on the surface of said substrate by the relative motion between said substrate and said polishing member substrate in the state where said substrate is held, wherein the protruded portions of the thin film on the surface of said substrate are flatly polished throughout the surface of said substrate, by pushing said substrate against the inner wall surface of said inner guide with the thrust generated by said relative motion, deforming said inner wall surface by contact profiling on the outer circumference of said substrate, and dispersing the reaction force applied to the outer circumference of said substrate with said deformation by contact profiling.

17. A method for polishing the surface of a semiconductor device substrate, comprising the steps of:

providing a substrate having a thin film on the surface thereof;

holding said substrate with a carrier comprising an inner guide that has an inner dimension larger than the outer dimension of said substrate, an outer guide that is provided outside of said inner guide in said carrier for keeping said carrier at a distance from a polishing member and an elastic member that can hold the back surface of said substrate inside said inner guide;

thereafter pushing the top surface of said substrate against a surface of said polishing member by applying pressure to the back surface of said substrate through said elastic member; and polishing the thin film on the surface of said substrate by the relative motion between said substrate and said polishing member, wherein the protruded portions of the thin film on the surface of said substrate are flatly polished throughout the surface of said substrate, by the steps comprising pushing and restricting at least a part of an outer circumference of said substrate against a depressed groove formed on an inner wall surface of said inner guide in the shape substantially similar to the shape of said substrate by thrust generated by the relative motion, and controlling the distance between the outer circumference of said substrate and the surface of said polishing member.

18. A method for polishing the surface of a semiconductor device substrate, comprising the steps of:

providing a substrate having a thin film on the surface thereof;

holding said substrate with a carrier comprising an inner guide that has an inner dimension larger than the outer dimension of said substrate, an outer guide that is provided outside of said inner guide in said carrier for keeping said carrier at a distance from a polishing member and an elastic member that can hold the back surface of said substrate inside said inner guide;

thereafter pushing the surface of said substrate against the surface of said polishing member by applying pressure to the back surface of said substrate through said elastic member; and polishing the thin film on the surface of said substrate by the relative motion between said substrate and said polishing member substrate in the state where said substrate is held, wherein the protruded portions of the thin film on the surface of said substrate are flatly polished throughout the surface of said substrate, by the steps comprising holding said substrate with a carrier that has an elastic member consisting of a thin plate having a plurality of through holes and an elastic material having a smaller modulus of elasticity than said thin plate, laminated on said thin plate to form flow passages connected to said through holes, by sucking the back surface of said substrate through said through holes; pushing said substrate against the inner wall surface of said inner guide with the thrust generated by said relative motion; and reducing the reaction force applied to the outer circumference of said substrate.

19. A method for polishing the surface of a semiconductor device substrate, comprising the steps of:

providing a substrate having a thin film on the surface thereof;

holding said substrate with a carrier comprising an inner guide that has an inner dimension larger than the outer dimension of said substrate, an outer guide that is provided outside of said inner guide in said carrier for keeping said carrier at a distance from a polishing member and an elastic member that can hold the back surface of said substrate inside said guide;

thereafter pushing the surface of said substrate against the surface of said polishing member by applying pressure to the back surface of said substrate through said elastic member; and polishing the thin film on the surface of said substrate by the relative motion between said substrate and said polishing member, wherein the protruded portions of the thin film on the surface of said substrate are flatly polished throughout the surface of said substrate, by the steps comprising pushing and restricting at least a part of the circumference of said substrate with the thrust generated by said relative motion against recessed groove formed on a plurality of wall surfaces protruded on the inner wall surface at a constant distance inside said inner guide in a shape having an envelope substantially similar to the outer diameter of said substrate, and controlling the distance between the outer circumference of said substrate and the surface of said polishing member.

* * * * *